(12) United States Patent
Omelyanchouk et al.

(10) Patent No.: US 6,885,325 B2
(45) Date of Patent: Apr. 26, 2005

(54) SUB-FLUX QUANTUM GENERATOR

(75) Inventors: Alexander N. Omelyanchouk, Kharkov (UA); Anatoly Y. Smirnov, Vancouver (CA)

(73) Assignee: D-Wave Systems, Inc., Vancouver (CA)

(*) Notice: Subject to any disclaimer, the term of this patent is extended or adjusted under 35 U.S.C. 154(b) by 0 days.

(21) Appl. No.: 10/445,096

(22) Filed: May 23, 2003

(65) Prior Publication Data

US 2004/0098443 A1 May 20, 2004

Related U.S. Application Data

(60) Provisional application No. 60/383,579, filed on May 24, 2002.

(51) Int. Cl.[7] .................................................. H03M 1/00
(52) U.S. Cl. ........................................ 341/133; 257/31
(58) Field of Search ........................... 341/133; 257/31, 257/401, 761

(56) References Cited

U.S. PATENT DOCUMENTS

| | | | | | |
|---|---|---|---|---|---|
| 4,028,714 | A | * | 6/1977 | Henkels ........................ | 257/35 |
| 5,162,731 | A | * | 11/1992 | Fujimaki ..................... | 324/248 |
| 5,329,165 | A | * | 7/1994 | Kao et al. ...................... | 307/91 |
| 6,495,854 | B1 | | 12/2002 | Newns et al. .................. | 257/31 |
| 6,504,172 | B1 | | 1/2003 | Zagoskin et al. ............. | 257/14 |
| 6,563,310 | B1 | | 5/2003 | Zagoskin ..................... | 324/248 |
| 6,728,131 | B1 | | 4/2004 | Ustinov ........................ | 365/162 |
| 2002/0117656 | A1 | | 8/2002 | Amin et al. .................... | 257/9 |
| 2002/0188578 | A1 | | 12/2002 | Amin et al. .................... | 706/15 |
| 2003/0071258 | A1 | * | 4/2003 | Zagoskin et al. ............. | 257/31 |
| 2003/0193097 | A1 | | 10/2003 | Il'ichev et al. ........ | 257/E27.07 |
| 2004/0000666 | A1 | | 1/2004 | Lidar et al. .................... | 257/31 |
| 2004/0071019 | A1 | | 4/2004 | Magnus et al. ............. | 365/200 |

OTHER PUBLICATIONS

Barone, A., T. Hakioglu, and I.O. Kulik, 2002, "Quantum Computation with Aharonov–Bohm Qubits" ArXiv.org preprint server: cond–mat/ 0203038, last accessed on Jul. 27, 2004.

Bocko, M.F., A.M. Herr, and M.J. Feldman, 1997, "Prospects for quantum coherent computation using superconducting electronics," IEEE Trans. Appl. Supercond. 7, pp. 3638–3641.

Cottet, A., D. Vion, A. Aassime, P. Joyez, D. Esteve, and M.H. Devoret, 2002, "Implementation of a combined charge–phase quantum bit in a superconducting circuit," Physica C 367, pp. 197–203.

DiVincenzo, D.P., 2000, "The Physical Implementation of Quantum Computational," ArXiv.org preprint server: quant–ph/0002077, last accessed on Jul. 27, 2004. 1 page.

(Continued)

*Primary Examiner*—Peguy JeanPierre
(74) *Attorney, Agent, or Firm*—Jones Day; Brett Lovejoy

(57) ABSTRACT

A sub-flux quantum generator includes an N-turn ring having a plurality of connected turns about a common aperture. The width of each respective turn in the N-turn ring exceeds the London penetration depth of a superconducting material used to make the respective turn. The generator includes a switching device configured to introduce a reversible localized break in the superconductivity of at least one turn in the N-turn ring. The generator includes a magnetism device configured to generate a magnetic field within the aperture of the N-turn ring. A method for biasing a superconducting structure that encompasses all or a portion of an N-turn ring. While a supercurrent is flowing through the N-turn ring, a quantized magnetic flux is introduced into the aperture of the N-turn ring using a reversible localized break in a turn in the ring. The quantized magnetic flux is trapped in the ring by removal of the localized break. The trapped flux biases the superconducting structure.

42 Claims, 15 Drawing Sheets

OTHER PUBLICATIONS

Cottet, A., D. Vion, A. Aassime, P. Joyez, D. Esteve, and M.H. Devoret, 2002, "Implementation of a combined charge–phase quantum bit in a superconducting circuit," Physica C 367, pp. 197–203.

DiVincenzo, D.P., 2000, "The Physical Implementation of Quantum Computational," ArXiv.org preprint server: quant–ph/0002077, last accessed on Jul. 27, 2004. 1 page.

Ketchen, M.B., 1987, "Integrated Thin Film dc–SQUID senors," IEEE Transactions on Magnetics 23, pp. 1650–1657.

Hu, X., R. de Sousa, and S. Das Sarma, "Decoherence and dephasing in spin–based solid state quantum computers," arXiv.org:cond–mat/0108339 (2001), website last accessed on Jul. 27, 2004, 1 page.

Majer, J.B., J.R. Butcher, and J.E. Mooij, 2002, "Simple phase bias for superconducting circuits," Applied Physics Letters 80 pp. 3638–3640.

Olariu, S., and I.I. Popescu, 1985, "The quantum effects of electromagnetic fluxes," Rev. Mod. Phys. 57, pp. 339–436 and 13 pages of figures.

Nakamura, Y., Yu.A. Pashkin, and J.S. Tsai, 1999, "Coherent control of macroscopic quantum states in a single–Cooper–pair box," Nature 398, pp. 786–788.

Lidar, D.A., and L.–A. Wu, 2002, "Reducing Constraints on Quantum Computer Design by Encoded Selective Recoupling," Phys. Rev. Lett. 88, 017905, pp. 1–4.

Lidar, D.A., L.–A. Wu, and A. Blais, 2002, "Quantum Codes for Simplifying Design and Suppressing Decoherence in Superconducting Phase–Qubits," Quant. Inf. Proc. 1, pp. 155–182.

Makhlin, Y., G. Schön, and A. Shnirman, 2001, "Quantum–state engineering with Josephson–junction devices," Rev. Mod. Phys. 73, pp. 357–400.

Mooij, J.E., T.P. Orlando, L. Levitov, L. Tian, C.H. van der Wal, and S. Lloyd, 1999, "Josephson persistant–current qubit," Science 285, pp. 1036–1039.

Orlando, T.P, 1990, *Foundations of Applied Superconductivity*, (Addison Wesley, Reading Massachusetts) pp. 90–93, 474–483.

Orlando, T.P, J.E. Mooij, L. Tian, C.H. van der Wal, L.S. Levitov, S. Lloyd, and J.J. Mazo, 1999, "Superconducting persistent–current qubit," Phys. Rev. B 60, 15398.

W.H. Zurek, 1991, "Decoherence and the transition from quantum to classical," Physics Today, 44, 10, pp. 36–44.

* cited by examiner

SUB-FLUX QUANTUM GENERATOR

CROSS-REFERENCE TO RELATED APPLICATION

This application claims benefit, under 35 U.S.C. §119(e), of U.S. Provisional Patent Application Ser. No. 60/383,579 filed on May 24, 2002 which is incorporated herein, by reference, in its entirety.

FIELD OF THE INVENTION

This invention relates to superconducting circuitry. More specifically, this invention relates to devices that generate fractions of a flux quantum.

BACKGROUND

Quantum computing is accomplished using the effects of qubits that exhibit quantum mechanical behavior. A qubit is a physical system that is restricted to two or more energy states. A qubit is a quantum bit, the counterpart in quantum computing to the binary digit or bit of classical computing. Just as a bit is the basic unit of information in a classical computer, a qubit is the basic unit of information in a quantum computer. A qubit is conventionally a system having two or more discrete energy states. The energy states of a qubit are generally referred to as the basis states of the qubit. The basis states of a qubit are termed the |0> and |1> basis states. Typically, in quantum computing applications, a qubit is placed (e.g., biased) to a state where two of the discrete energy states of the qubit are degenerate. Energy states are degenerate when they possess the same energy.

A qubit can be in any superposition of two basis states, making it fundamentally different from a bit in an ordinary digital computer. A superposition of basis states arises in a qubit when there is a non-zero probability that the system occupies more than one of the basis states at a given time. Qualitatively, a superposition of basis states means that the qubit can be in both basis states |0> and |1> at the same time. Mathematically, a superposition of basis states means that the overall state of the qubit, which is denoted |Ψ>, has the form $|\Psi\rangle = a|0\rangle + b|1\rangle$ where a and b are coefficients respectively corresponding to probability amplitudes $|a|^2$ and $|b|^2$. The coefficients a and b each have real and imaginary components, which allows the phase of qubit to be modeled. The quantum nature of a qubit is largely derived from its ability to exist in a superposition of basis states, and for the state of the qubit to have a phase.

If certain conditions are satisfied, N qubits can define a state that is a combination of $2^N$ classical states. This state undergoes evolution, governed by the interactions that the qubits have among themselves and with external influences, providing quantum mechanical operations that have no analogy with classical computing. The evolution of the states of N qubits defines a calculation or, in effect, $2^N$ simultaneous classical calculations. Reading out the states of the qubits after evolution completely determines the results of the calculations.

It is held by some in the art that certain quantum computing algorithms, such as the Shor algorithm, require that the number of qubits in the quantum computer must be at least $10^4$. See Mooij et al., 1999, *Science* 285, p. 1036, which is hereby incorporated by reference in its entirety. Qubits have been implemented in cavity quantum dynamic systems, ion traps, and nuclear spins of large numbers of identical molecules. However, such systems are not particularly well suited for the realization of the desired high number of interacting qubits needed in a quantum computer. A survey of the current physical systems from which qubits can be formed is Braunstein and Lo (eds.), *Scalable Quantum Computers*, Wiley-VCH Verlag GmbH, Berlin (2001), which is hereby incorporated by reference in its entirety. Of the various physical systems surveyed, the systems that appear to be most suited for scaling (e.g., combined in such a manner that they interact with each other) are those physical systems that include superconducting structures such as superconducting qubits.

A proposal to build a scalable quantum computer from superconducting qubits was published in 1997. See Bocko et al., 1997, *IEEE Trans. Appl. Supercon.* 7, p. 3638, and Makhlin et al., 2001, *Rev. of Mod. Phys.*, 73, p. 357, which are hereby incorporated by reference in their entireties. Since then, many designs have been introduced. One such design is the persistent current qubit. See Mooij et al., 1999, *Science* 285, 1036; and Orlando et al., 1999, *Phys. Rev. B* 60, 15398, which are hereby incorporated by reference in their entireties.

A description of the persistent current qubit, as described in Mooij et al., is illustrated by circuit 700 in FIG. 7. Circuit 700 consists of a loop with three small-capacitance Josephson junctions (702-1, 702-2, and 702-3) in series. In operation, circuit 700 encloses a magnetic flux $fM_0$. Here, $M_0$ is the superconducting flux quantum h/2e (i.e., fluxon, flux quantum) where h is Plank's constant and e is elementary charge. See Tinkham, *Introduction to Superconductivity*, McGraw-Hill, Inc., New York, 1996, which is hereby incorporated by reference in its entirety, for a theoretical description of the fluxon. In operation, the magnetic flux $fM_0$ enclosed by circuit 700 is created by applying an external magnetic flux with magnitude $fM_0$ to circuit 700. This external magnetic flux is referred to as an applied magnetic flux, applied magnetic frustration, or simply frustration flux. Two of the junctions 702 in circuit 700 have equal Josephson coupling energies $E_j$. The Josephson coupling energy of the third junction 702 is less than the coupling energy $E_j$ of the first two junctions 702. Typically, the Josephson energy of the third junction 702 is $\alpha E_j$, with $0.5 < \alpha < 1$.

An important feature of the Josephson energy in circuit 700 is that it is a function of two phases. For a range of frustration fluxes $fM_0$, where f represents some range of numbers, these two phases permit two stable configurations that correspond to dc currents flowing in opposite directions. In fact, for f=0.5 (i.e., $0.5 \times M_0$, one half a fluxon), the energies of the two stable configurations (states) are the same (are degenerate). Thus, when an external magnetic force having the magnitude $fM_0$ (where f=0.5) is applied against circuit 700, the circuit acts as a persistent current qubit with two degenerate states. One of the degenerate states, represented by a clockwise dc current 720 circulating in circuit 700, may be arbitrarily assigned the basis state |0>. Then the other degenerate state, represented by a counter-clockwise dc current 722 circulating in circuit 700, is assigned the basis state |1>. Another property of circuit 700 is that the barrier for quantum tunneling between the two degenerate states depends strongly on the value α. Larger values α (i.e., higher Josephson energy in the third junction 702) result in higher tunneling barriers.

One advantage of superconducting qubits is that they are scalable. A disadvantage of persistent current qubit 700 is that it is difficult to provide a stable source for the applied magnetic flux $fM_0$ that is necessary to produce the two degenerate states. Fluctuations in the frustration flux can decohere the states of the qubit making computation difficult or unreliable. Decoherence is the loss of the phases of quantum superpositions in a qubit as a result of interactions with the environment. Thus, decoherence results in the loss of the superposition of basis states in a qubit. See, for example, Zurek, 1991, Phys. Today 44, p. 36; Leggett et al., 1987, Rev. Mod. Phys. 59, p. 1; Weiss, 1999, Quantitative Dissipative Systems, $2^{nd}$ ed., World Scientific, Singapore; Hu et al; arXiv:cond-mat/0108339, which are herein incorporated by reference in their entireties. Inductance from normal electronics is not suitable for producing degenerate states in a persistent current qubit. Any disruption in the current through such electronics will disrupt the degenerate states. Vibrations of the system can cause a change in the level of frustration (level of bias). Even the briefest interruption in the degeneracy of the states will destroy the quantum computation performed on the qubit.

One approach to trap flux is through flux quantization in a ring of superconducting material that has a cross section that is larger than the London penetration depth $\lambda_L$. In this approach, an external flux of about one flux quantum is applied to ring while cooling the ring down through the superconducting phase transition. Once below the superconducting phase transition temperature, the center of the ring (the aperture of the ring) will have a magnetic flux of one flux quantum because it will be trapped by the surrounding superconducting material. Then, the external field is removed. When the external magnetic field is removed in a nonsuperconducting ring, the magnetic flux in the center of the ring pierces the ring and is annihilated. However, this is not possible in a superconducting ring because the magnetic flux trapped in the center of the ring cannot penetrate the superconducting ring. Thus, in this way, a ring is capable of trapping magnetic field in multiples of the magnetic flux quantum (i.e., 1×h/2e, 2×h/2e, 3×h/2e, and so forth). The flux is quantized because the wavefunction of the supercurrent is naturally single valued. This means the integral of the phase around the ring of superconducting material should be a multiple of $2\pi$.

One possibility for providing an applied magnetic flux to a persistent current qubit is a superconducting ring recently proposed by Majer et al. See Majer et al., 2002, Applied Physics Letters 80, p. 3638 which is hereby incorporated by reference in its entirety. Majer et al. proposed a mesoscopic (e.g., having a diameter of 3 µm) superconducting ring 800 (FIG. 8) that has no junctions. A superconducting material is a material that has zero electrical resistance below critical levels of current, magnetic field and temperature. The Majer et al. ring has a cross section 802 that is narrower than the London penetration depth $\lambda_L$ of the ring. The London penetration depth $\lambda_L$ describes the exponentially decaying magnetic field in layers just below the surface of a superconductor. In general, magnetic fields are excluded within superconducting materials. The exclusion of magnetic fields deep in a superconducting material is known as the Meissner effect. However, in shallow layers just below the surface of superconducting materials, the extent to which magnetic fields are excluded is exponentially dependent on the distance between the layer and the surface of the superconductor. The London penetration depth $\lambda_L$ of a superconducting material is the distance from the material surface to a point in the material where magnetic flux is $e^{-1}$ times less than at the material surface. Here, e is the base of the natural logarithm. London penetration depth is material dependent but typically on the order of 500 Å for some superconducting materials.

As mentioned above, the ring proposed by Majer et al. has a cross section 802 that is narrower than the London penetration depth $\lambda$ of the ring. However, the ring 800 can be used to trap magnetic flux through the phenomena of fluxoid quantization, which is a distinctly different phenomena than the phenomena of flux quantization described above. The difference between flouxoid quantization and flux quantization is that, although the resultant magnetic field is the same, the origins of the magnetic field differ. In flux quantization of a thick ring, the magnetic field in the ring is comprised of a trapped magnetic field. In fluxiod quantization of a ring that is narrower than the London penetration depth of the ring, the magnetic field in the ring is induced by circulating current that remains in the ring. See M. Tinkham, 1996, Introduction to Superconductivity, McGraw Hill, which is hereby incorporated by reference in its entirety. In one approach, an external flux quantum is applied to ring 800 while cooling the ring down through the superconducting phase transition. The center of ring 800 will have a magnetic flux quantum because of the presence of the external magnetic flux. Then, once ring 800 is superconducting, the external field is removed. When the external magnetic field is removed in a nonsuperconducting ring, the magnetic flux in the center of the ring pierces the ring and is annihilated. However, this is not possible in the ring proposed by Majer et al. because the magnetic flux is induced in the center of the ring by superconducting current in the ring. A superconducting ring is capable of trapping magnetic field in multiples of the magnetic flux quantum (i.e., 1×h/2e, 2×h/2e, 3×h/2e, and so forth). The magnetic field is comprised of the trapped flux and the flux generated by the circulating current. The Majer et al. ring provides no mechanism for releasing trapped magnetic flux. The trapped magnetic flux can be used as a source for applying a stable magnetic field to a persistent current qubit. The trapped magnetic flux in the Majer et al. ring is advantageous because it is not sensitive to fluctuations in applied current. In fact, no applied current is required to maintain the trapped magnetic flux in the Majer et al. ring 800 once it has been trapped in the aperture of the ring.

While ring 800 represents a significant achievement in the art, it does not provide a satisfactory device for applying an external biasing (frustrating) magnetic field to a persistent current qubit for two reasons. First, ring 800 does not provide a mechanism for trapping or releasing trapped magnetic flux. The only way to trap or release the trapped magnetic flux in ring 800 is to destroy the superconducting properties of the ring. This can be accomplished, for example, by raising the temperature of the ring through the critical temperature $T_C$ of the superconducting material used to manufacture the ring. Second, ring 800 is not capable of trapping sub-fluxon quantities of magnetic flux. That is, ring 800 is not capable of trapping a magnetic flux having a magnitude that is a fraction of h/2e. Yet, many persistent current qubits, such as circuit 700, require an external magnetic force having a magnitude that is a fraction of a fluxon in order to achieve two degenerate states.

Given the above background, what is needed in the art is a mechanism for delivering a stable and switchable flux source with sub-fluxon precision.

Discussion or citation of a reference herein shall not be construed as an admission that such reference is prior art to the present invention.

SUMMARY OF THE INVENTION

The present invention provides a switchable stable sub-flux quantum generator. In one embodiment of the invention, an N-turn ring is used to trap fluxon or sub-fluxon amounts of magnetic flux. Furthermore, each turn of the N-turn ring includes a switch. By regulating the switches in the N-turn ring, the amount of magnetic flux in the N-turn ring can be used to control the amount of magnetic flux trapped within the ring with sub-fluxon precision. The switchable N-turn ring provides a reliable external magnetic flux that can be used to bias a persistent current qubit, such as circuit 700, so that the two stable states of the qubit are degenerate.

One embodiment of the present invention provides a sub-flux quantum generator. The sub-flux quantum generator comprises an N-turn ring that includes N connected turns, where N is an integer greater than or equal to two. Further, each turn in the N-turn ring has a width that exceeds the London penetration depth $\lambda_L$ of the superconducting material used to make each turn in the N-turn ring. The sub-flux quantum generator further comprises a switching device that introduces a reversible localized break in the superconductivity of at least one turn in the N-turn ring. The sub-flux quantum generator also includes a magnetism device that generates a magnetic field within the N-turn ring.

In some embodiments, the sub-flux quantum generator includes a set of leads that is attached to the N-turn ring. The magnetism device is in electrical communication with the set of leads in order to drive a current through the N-turn ring. In some embodiments of the present invention, the superconducting material used to make a turn in the N-turn ring is a type I superconductor such as niobium or aluminum. In some embodiments of the present invention, the superconducting material used to make a turn in the N-turn ring is a type II superconductor.

In some embodiments, the switching device in sub-flux quantum generator is a cryotron that encompasses a portion of one or more of the turns in the N-turn ring. In some embodiments, the switching device in the sub-flux quantum generator is a Josephson junction that is capable of toggling between a superconducting zero voltage state and a nonsuperconducting voltage state. In some embodiments, this Josephson junction includes a set of critical current leads that are used to drive a critical current through the Josephson junction to toggle the Josephson junction between the superconducting zero voltage state and the nonsuperconducting voltage state.

Another aspect of the present invention provides a superconducting device comprising an outer structure and an inner structure. The outer structure comprises a superconducting ring that encompasses at least a portion of the inner structure. This superconducting ring includes at least one Josephson junction. The inner structure comprises an N-turn ring that includes N connected turns. Turns are connected when they make contact with each other. In some embodiments, the turns are twined. However, there is no requirement that the turns in an N-turn ring twine (twist) about each other in an N-turn ring. In some embodiments, all that is required is that each turn in an N-turn ring make contact with at least one other turn in the N-turn ring. As used herein, the value N for the N-turn ring means an integer greater than or equal to two. Further, each turn in the N-turn ring has a width that exceeds the London penetration depth $\lambda_L$ of a superconducting material used to make each turn in the N-turn ring. In some embodiments of the present invention, the outer structure is a qubit, such as a phase qubit, or more specifically, a persistent current qubit. In some embodiments, the inner structure further comprises a switching device that is capable of introducing a reversible localized break in the superconductivity of at least one turn in the N-turn ring.

Another aspect of the present invention provides a method for trapping a quantized magnetic flux in an N-turn ring. Here, N is an integer greater than or equal to two. In the method, a supercurrent is allowed to flow through the N-turn ring. Next, a quantized magnetic flux $\Phi_X$ is induced in an aperture of the N-turn ring by introducing a localized break in a turn in the N-turn ring. This localized break interrupts the supercurrent in a portion of the turn. Later, the supercurrent is restored to the effected portion of the turn by removing the localized break, thereby trapping the quantized magnetic flux in the N-turn ring. In some embodiments, the localized break in the turn is introduced by passing a bias current through a Josephson junction present in the portion of the turn. The bias current causes the Josephson junction to toggle from a superconducting zero voltage state to a nonsuperconducting voltage state.

Still another aspect of the present invention provides a method for frustrating (biasing) a superconducting structure that encompasses a portion of an N-turn ring (where N is an integer equal to two or greater). In the method, supercurrent is allowed to flow through the N-turn ring. Next, a quantized magnetic flux $\Phi_X$ is induced in an aperture of the N-turn ring by introducing a localized break in a turn in the N-turn ring. The localized break interrupts the supercurrent in the portion of the turn. Then the quantized magnetic flux is trapped in the N-turn ring by removing the localized break and restoring the supercurrent to the effected portion of the turn, thereby frustrating the superconducting structure that encompasses the portion of the N-turn ring.

BRIEF DESCRIPTION OF THE DRAWINGS

Like reference numerals refer to corresponding parts throughout the several views of the drawings.

DETAILED DESCRIPTION

One embodiment of the present invention provides an N-turn ring that is used to trap fluxon or sub-fluxon amounts of magnetic flux when superconducting current flows through the N-turn ring. As observed experimentally by Henry and Deaver in 1968, the magnetic flux trapped by a superconducting N-turn ring is quantized in multiples of h/N2e, where N is the number of times an inaccessible region is encircled by the N-turn ring, h is Plank's constant, and e is elementary charge. See Henry and Deaver, 1968, *Bull. Am. Phys. Soc.* 13, 1691; and Olariu and Popescu, 1985, *Rev. Mod. Phys.* 57:2, pp. 339–436, especially pages 412–413, which are hereby incorporated by reference in their entireties. This relationship assumes that each turn in the N-turn ring encircles approximately the same area. A two-turn superconducting ring can trap one half of a flux quantum (i.e. one half of a fluxon, 0.5×h/2e). An N-turn ring has N turns. These N turns are optionally intertwined. Furthermore, in one embodiment of the inventive device, each turn of the N-turn ring includes a switch. By regulating the switches in the N-turn ring, the amount of magnetic flux trapped in the N-turn ring can be controlled with sub-fluxon precision.

One aspect of the present invention provides a sub-flux quantum generator that includes an N-turn ring made from superconducting materials. The sub-flux quantum generator can produce a stable and switchable flux source with sub-fluxon precision. Sub-flux quantum generators have numerous applications in devices that require a reliable magnetic field having a magnitude in the single fluxon or sub-fluxon range. For example, the sub-flux quantum generators in accordance with this aspect of the present invention can be used to reliably frustrate a persistent current qubit in order to make the basis states of the persistent current qubit degenerate. In one case, the sub-flux quantum generators are used to frustrate circuit 700 with a magnetic flux having a magnitude of one half of a fluxon, in order to make the two stable states associated with the circuit degenerate.

Figure 1:
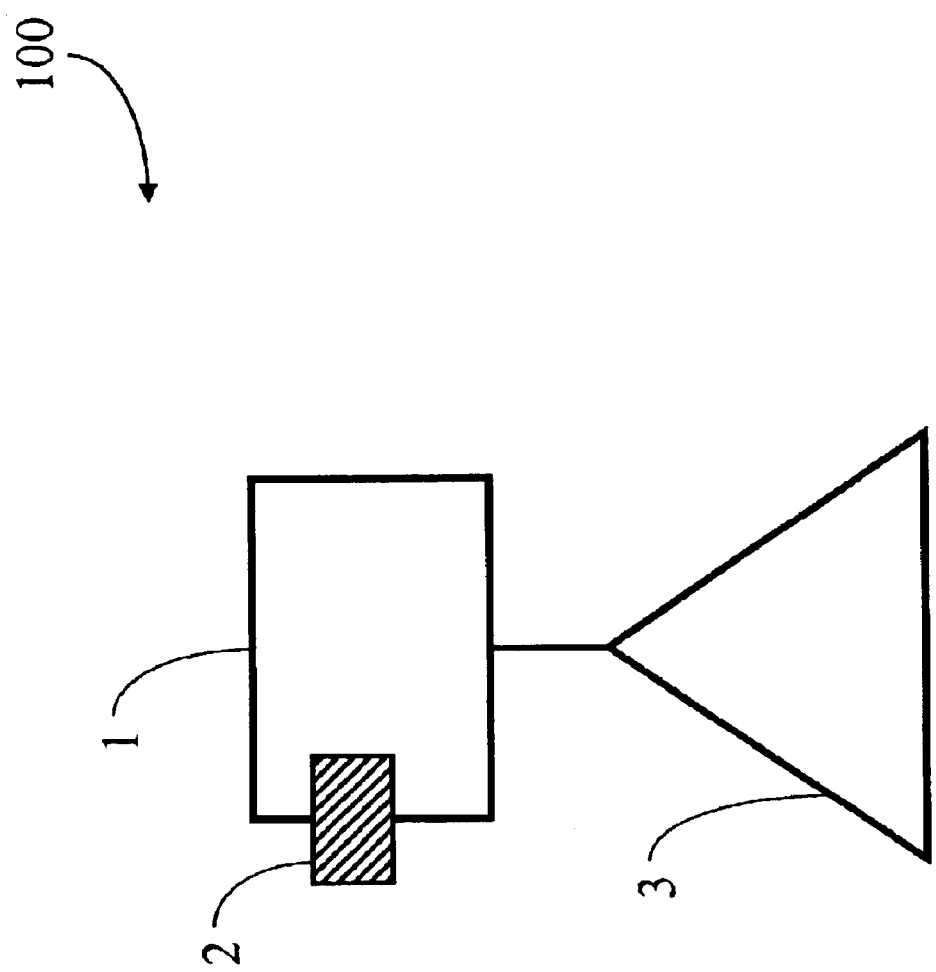
FIG. 1 illustrates the relationship between generalized components of one embodiment of the present invention, including an N-turn ring, a switching device, and a magnetism device.

FIG. 1 presents a generic embodiment of one embodiment of the invention. FIG. 1 illustrates a sub-flux quantum generator 100 that is capable of trapping sub-fluxon magnitudes of magnetic flux. Sub-flux quantum generator 100 includes three components, (labeled 1, 2, and 3). They are an N-turn ring 1 of superconducting material, a switching device 2 to break the superconductivity of N-turn ring 1, and a magnetism device 3 for presenting magnetic flux to N-turn ring 1. In some embodiments, each turn (ring) in an N-turn ring of the present invention is made from a different material. Thus, for example, in some embodiments, a first turn in the N-turn ring is made from a first superconducting material and a second turn in the N-turn ring is made from a second superconducting material. As used herein, N is any integer greater than or equal to two. Thus, N=2, 3, 4, 5, 6, and so forth. Switching device 2 is used to interrupt the superconducting current in N-turn ring 1 in a controllable fashion. Magnetism device 3 provides a magnetic flux that has a substantial component normal with respect to the principle plane of N-turn ring 1. Magnetism device 3 is used to generate magnetic flux that is ultimately trapped by N-turn ring 1.

Description and Fabrication of N-turn Ring 1

FIGS. 2A–2D illustrate a method of making an N-turn ring 1 in accordance with one embodiment of the present invention. The exemplary fabrication process begins in FIG. 2A. A substrate 30 is presented with one side prepared for material deposition and patterning. The actual choice of material for substrate 30 is application dependent. In some embodiments, substrate 30 is made of silicon, fused-silica ($SiO_2$), magnesium oxide(MgO), lanthanum aluminum oxide ($LaAlO_3$), quartz, or sapphire. In some embodiments, substrate 30 is made from alkali-free borosilicate glass (Shott AF45). Superconducting material is deposited on substrate 30 and patterned to produce a turn 50 with an aperture 49 and a break 62 between leads 61-1 and 61-2. Choices for substrate 30, and methods for material deposition and patterning of turn 50 are described in Van Zant, *Microchip Fabrication*, Fourth Edition, McGraw-Hill, New York, 1997; Rai-Choudhury, *Microlithography, Micromachining and Microfabrication Volume 1: Microlithography*, The International Society for Optical Engineering, Bellingham, Wash., 1997; and Madou, *Fundamentals of Microfabrication, Second Edition*, CRC Press, 2002, which are hereby incorporated by reference in their entireties. Leads 61 are used in a cross-over 60 that creates an N-turn ring in subsequent processing steps.

In one embodiment, break 62 between leads 61-1 and 61-2 exceeds the coherence length of the material used to form turn 50 in order to avoid stray Josephson effects. Coherence length is a material dependent phenomenon that arises because of the inability for superconducting electron density to change instantaneously. A minimum length (coherence length) is required to effectuate a change in the superconducting state of an electrical current. For example, a transition from the superconducting state to a normal state will have a transition layer of finite thickness that is dependent upon the coherence length of the material in which this transition takes place. Experimental studies of various superconductors has led to the following approximate values for coherence length: Sn (230 nm), Al (1600 nm), Pb (83 nm), Cd (760 nm) and Nb (38 nm).

Figure 2A:
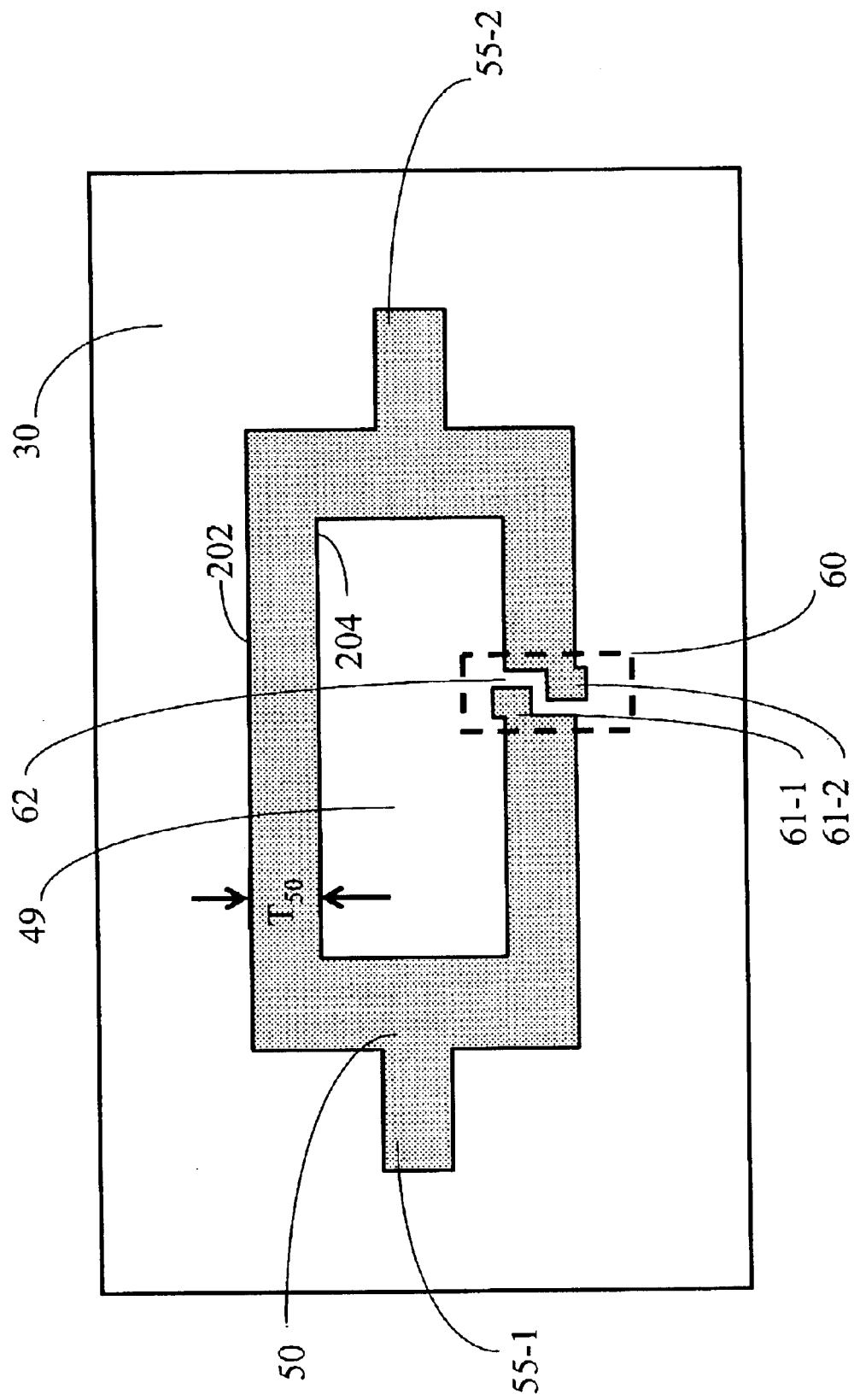
FIGS. 2A–2D illustrate a method for manufacturing an N-turn ring in accordance with an embodiment of the present invention.

In some embodiments, separation between leads 61-1 and 61-2 in excess of the coherence length of the material used to make turn 50 is desired in order to avoid stray capacitance in break 62. Optionally, leads 55 are patterned into ring 1. In one embodiment, leads 55 are placed at opposite sides of turn 50 as illustrated in FIG. 2A. In an embodiment of the present invention, turn 50 is made of a type I superconductor. Examples of type I superconductors include, but are not limited to, niobium (Nb), aluminum (Al), and lead (Pb).

In some embodiments, the material used to form turn 50, as with all material layers described in conjunction with FIG. 2, is deposited onto substrate 30 using a process such as dc-magnetron sputtering or pulsed laser deposition. The exact deposition process used will depend upon the nature of the compound used to make turn 50. Various deposition methods known in the art can be used depending on the properties material used to form turn 50. Such known deposition methods include, but are not limited to, chemical vapor deposition, low pressure chemical vapor deposition, reduced pressure chemical vapor deposition, atmospheric chemical vapor deposition, plasma assisted chemical vapor deposition, remote plasma chemical vapor deposition, anodic conversion, plasma spray deposition, jet printing, sol-gel processes, vacuum evaporation, sputter deposition (e.g., physical vapor deposition), collimated sputtering, laser ablated deposition, molecular beam deposition, ionized physical vapor deposition, ion beam deposition, atomic layer deposition, hot filament chemical vapor deposition, screen printing, electroless metal deposition, or electroplating. See, for example, Van Zant, *Microchip Fabrication*, Fourth Edition, McGraw-Hill, New York, 1997; Rai-Choudhury, *Microlithography, Micromachining and Microfabrication Volume 1: Microlithography*, The International Society for Optical Engineering, Bellingham, Wash., 1997; and Madou, *Fundamentals of Microfabrication, Second Edition*, CRC Press, 2002. In addition to these deposition techniques, those of skill in the art will recognize that there are number of other different methods by which layer 8010 may be deposited and all such methods are included within the scope of the present invention.

Once deposited, the superconducting material can be etched to form ring 50 using, for example, carbon tetrafluoride reactive ion etching (CF$_4$-RIE), argon (Ar) ion etching, or any other suitable deposition and etching techniques. In some embodiments, this patterning is assisted by depositing a resist layer over the superconducting material, patterning the resist layer using a photomask, etching the resist layer and the underlying superconducting material, and then developing away the resist layer in accordance with known lithographic methods.

Resists used to form a resist layer are typically comprised of organic polymers applied from a solution. Generally, to coat the superconducting material with resist, a small volume of the liquid is first dispensed on the layer of superconducting material that overlays the substrate. The substrate is then spun at a high rate of speed, flinging off excess resist and leaving behind, as the solvent evaporates, a resist layer. In some embodiments, resist layer has a thickness in the range of 0.1 μm to 2.0 μm.

In some embodiments, the resist layer that is applied over the superconducting material is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azide/isoprene negative resists, polymethylmethacrylate (PMMA), polymethylisopropyl ketone (PMIPK), poly-butene-1-sulfone (PBS), poly-(trifluoroethyl chloroacrylate) TFECA, poly-(2-methyl pentene-1-sulfone) (PMPS). In other embodiments, the resist layer is a positive resist. The positive resist is relatively unsoluble. After exposure to the proper light energy, the resist converts to a more soluble state. One positive photoresist in accordance with the present invention is the phenol-formaldehyde polymer, also called phenol-formaldehyde novolak resin. See, for example, DeForest, *Photoresist: Materials and Processes*, McGraw-Hill, New York, 1975, which is hereby incorporated by reference in its entirety. In some embodiments, the resist layer is LOR 0.5A, LOR 0.7A, LOR 1A, LOR 3A, or LOR 5A (MICROCHEM, Newton, Mass.). LOR lift-off resists use polydimethylglutarimide.

After the resist layer has been applied, the density is often insufficient to support later processing. Accordingly, in some embodiments of the present invention, a bake is used to densify the resist layer and drive off residual solvent. This bake is referred to as a softbake, prebake, or post-apply bake. Several methods of baking the resist layer are contemplated by the present invention including, but not limited to, convection ovens, infrared ovens, microwave ovens, or hot plates. See, for example, Levinson, Principles of Lithography, SPIE Press, Bellingham, Wash., 2001, pp. 68–70, which is hereby incorporated by reference in its entirety.

After the resist layer has been overlayed onto the superconducting layer, the next step is alignment and exposure of the resist layer. Alignment and exposure is a two-purpose photomasking step. The first part of the alignment and exposure step is the positioning or alignment of the required image on the wafer surface. The image is found on a phtotomask. The second part is the encoding of the image in the resist layer from an exposing light or radiation source. In the present invention, any conventional alignment system can be used to align the photomask with the resist layer, including but not limited to, contact aligners, proximity aligners, scanning projection aligners, steppers, step and scan aligners, x-ray aligners, and electron beam aligners. For a review of aligners that can be used in the present invention, see *Solid State Technology*, April 1993, p. 26; and Van Zant, *Microchip Fabrication*, Fourth Edition, McGraw-Hill, New York, 2000, pp. 232–241.

In one embodiment of the present invention, the tool used to project the pattern on the phtotomask onto the resist layer is a wafer stepper, e.g., a step-and-repeat stepper or a step-and-scan, stepper. See for example, Levison, *Principles of Lithography*, SPIE Press, Bellingham, Wash., 2001, pp. 133–174, which is hereby incorporated by reference. After exposure through the phototmask the pattern for turn 50 is coded as a latent image in the resist layer as regions of exposed and unexposed resist. The pattern is developed in the resist by chemical dissolution of the unpolymerized resist regions. There are several methods in which a developer can be applied to the resist in order to develop the latent image. Such methods include, but are not limited to, immersion, spray development, and puddle development. In some embodiments of the present invention, wet development methods are not used. Rather, a dry (or plasma) development is used. In such dry processes, a plasma etcher uses energized ions to chemically dissolve away either exposed or unexposed portions of the resist layer.

After development, an etching step is used to pattern the superconducting layer thereby forming turn 50. Exemplary etching methods, such as carbon tetrafluoride reactive ion etching (CF$_4$-RIE) and argon (Ar) ion etching have been referenced above. Additional etching techniques include, but are not limited to, wet etching, wet spray etching, vapor etching, plasma etching, ion beam etching and reactive ion etching. See, for example, Stolz et al., *Supercond. Sci. Technol.* 12 p. 806 (1999); Van Zant, *Microchip Fabrication*, Fourth Edition, McGraw-Hill, New York, 1997; Rai-Choudhury, *Microlithography, Micromachining and Microfabrication Volume* 1: *Microlithography*, The International Society for Optical Engineering, Bellingham, Wash., 1997; and Madou, *Fundamentals of Microfabrication, Second Edition*, CRC Press, 2002 which are hereby incorporated by reference in their entireties.

In general, structures can be patterned using the optical and/or electron beam lithographic steps described above. As described below, the formation of the N-turn ring of the present invention typically requires multiple layers with each layer requiring independent patterning. In such instances, the lithographic steps described above can be repeated for each layer as necessary in order to accomplish such patterning.

In one embodiment of the present invention turn 50, with the exception of junction 61, has a uniform width $T_{50}$ that is greater than the London penetration depth $\lambda_L$ of the superconducting material used to make turn 50. As used herein, at any given position in turn 50, width $T_{50}$ is the shortest distance between interior 204 of turn 50 to exterior 202 of turn 50 as illustrated in FIG. 2A. Such widths are desired so that turn 50 will trap magnetic flux in aperture 49 when the turn is superconducting. In some embodiments, the thickness of turn 50, with respect to the plane of substrate 30 (normal to width $T_{50}$), is uniform and is on the scale (e.g., between 1× and 5×) of the London penetration depth $\lambda_L$ of the superconducting material 50. This prevents the formation of weak spots where quantized magnetic flux may become trapped. London penetration depths $\lambda_L$ for some superconducting materials are: Sn (34 nm), Al (16 nm), Pb (37 nm), Cd (110 nm), and Nb (39 nm).

An intermediate material layer is deposited onto substrate 30 and turn 50. This intermediate material is patterned to form shape 40 (FIG. 2B), thereby exposing elements of turn 50, such as element 60 (including leads 61-1 and 61-2) and leads 55-1 and 55-2. In one embodiment of the present invention, the intermediate material layer is made from an insulator such as aluminum-oxide ($AlO_x$) or silicon-oxide ($SiO_x$). In one example, superconducting material 50 is made from Nb and the intermediate material is 400 nm thick $SiO_x$. In some embodiments, shape 40 has a width $T_{240}$ (FIG. 2B) that is less than $T_{50}$ (FIG. 2A). Embodiments where shape 40 has a width that is less than $T_{50}$ can require that shape 40 be made of an insulator with a low dielectric constant and high breakdown voltage. This is preferred in some embodiments in order to prevent electrical coupling such as stray capacitance or current shortage between individual turns within the N-turn ring.

Figure 2B:
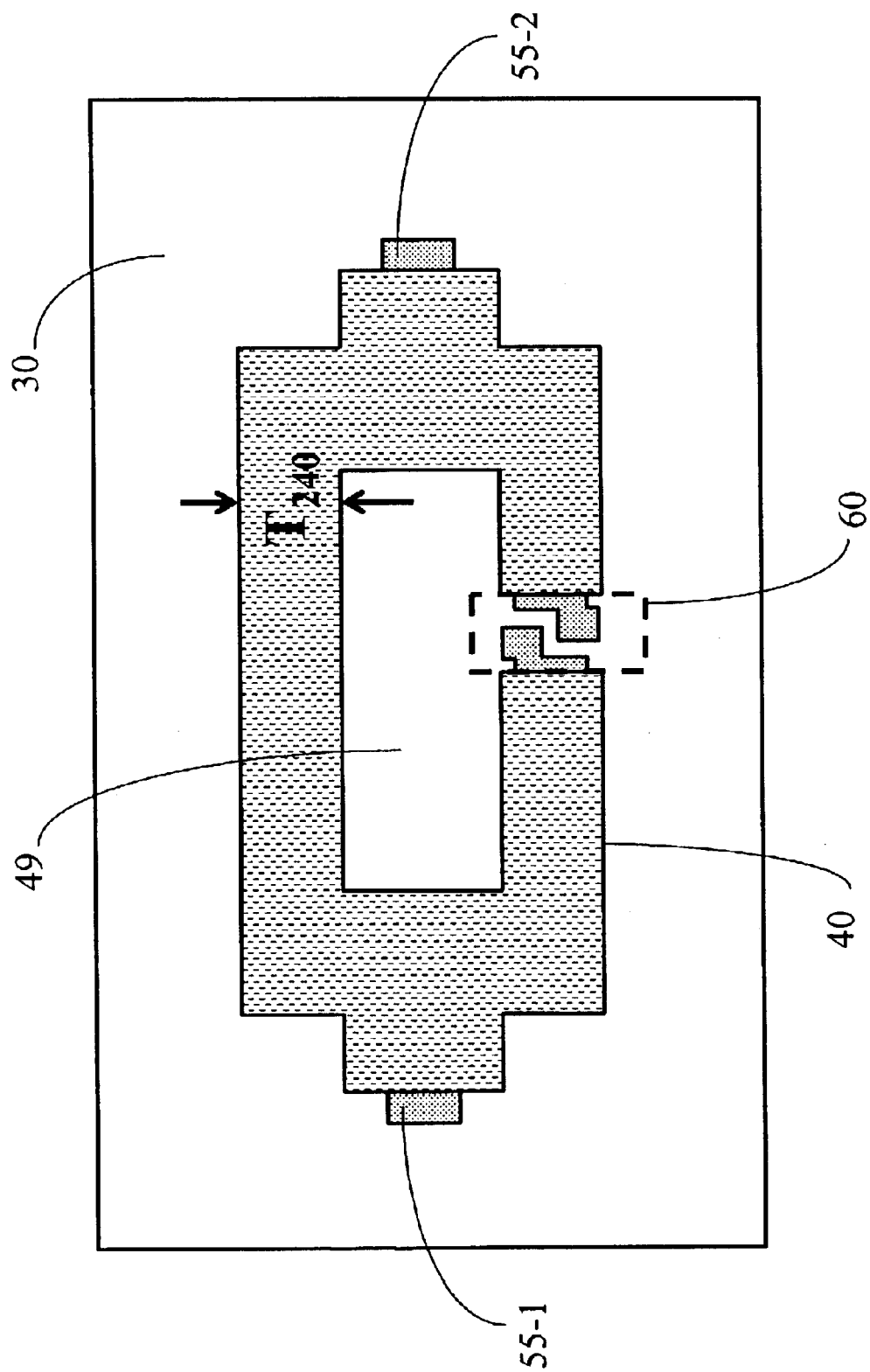
Figure 2C:
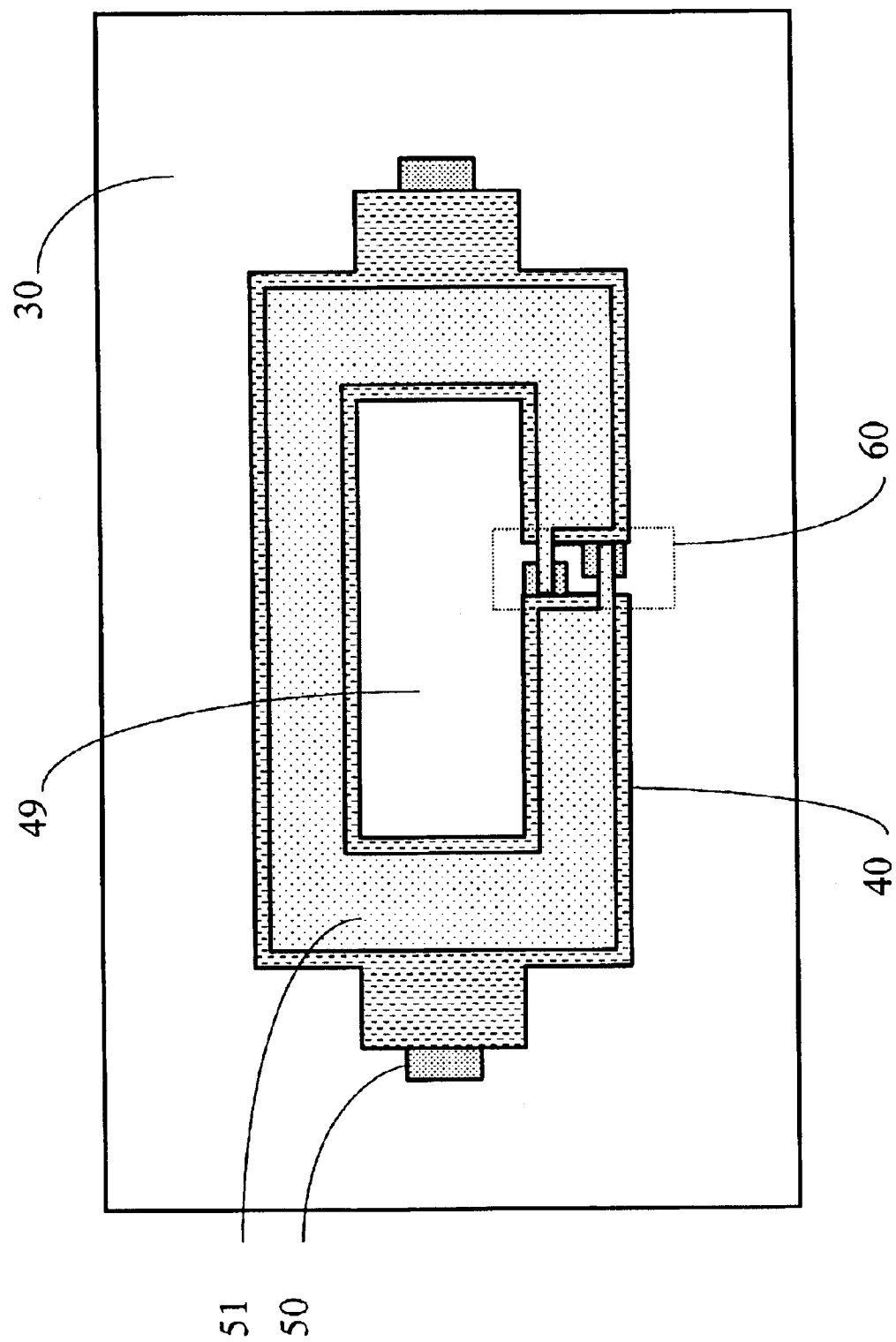

In FIG. 2C, an additional turn is added to the structure illustrated in FIG. 2B. A superconducting material layer is deposited and patterned to form turn 51 using techniques similar to those used to pattern turn 50. In typical embodiments, the same superconducting material is used to form turns 50 and 51. Furthermore, in typical embodiments, turns 50 and 51 have the same dimensions (e.g., same width $T_{50}$ as well as the same thickness). In some embodiments, turn 51 covers turn 50 without substantially obstructing aperture 49, regardless of whether turns 50 and 51 have the same dimensions. As used herein, aperture 49 is also termed a common aperture.

Figure 2D:
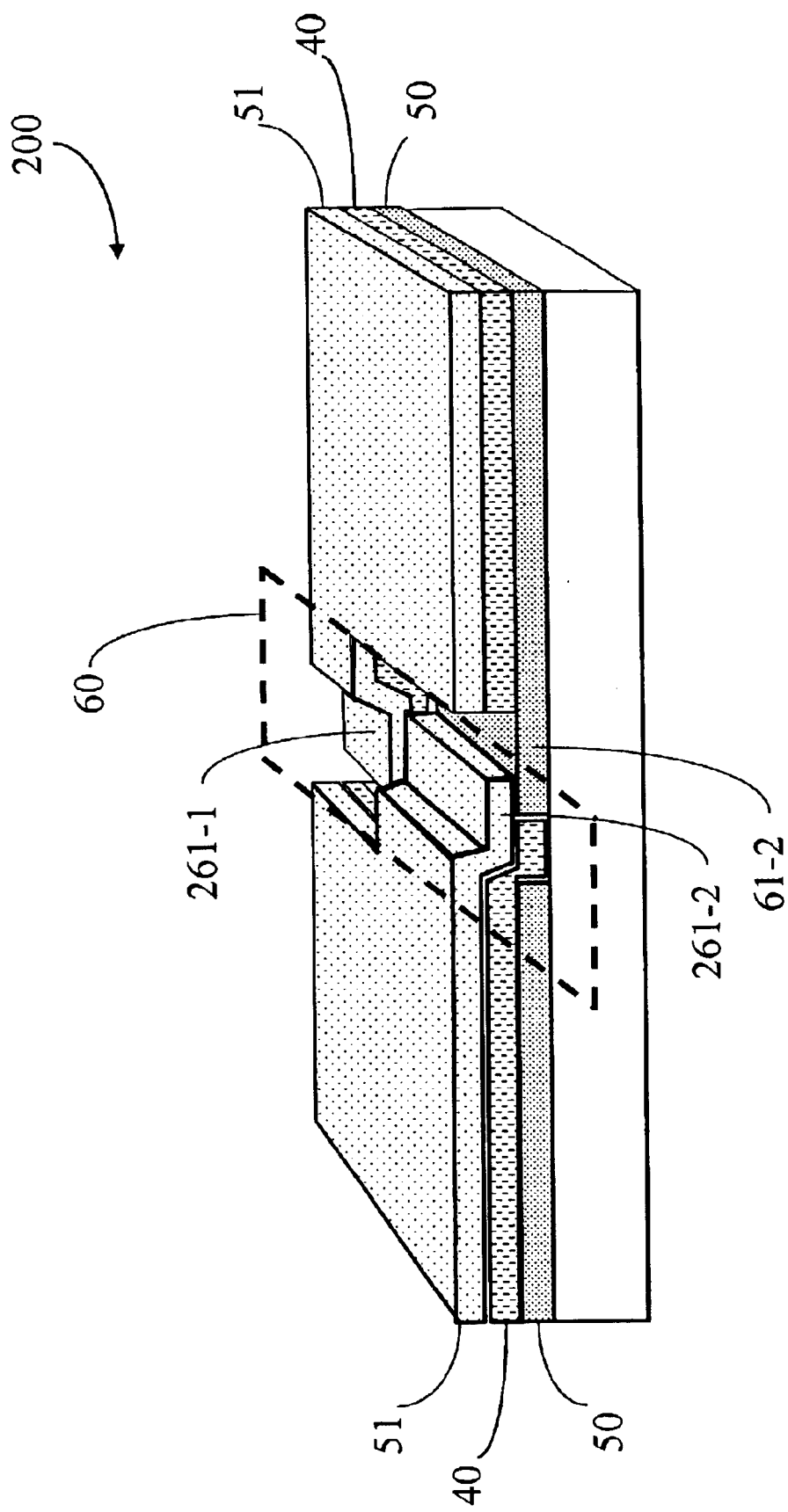

FIG. 2D depicts crossover 60 in a perspective view. Lead 61-1 (not shown) and lead 61-2 of turn 50 are joined with leads 261-1 and 262-2 of turn 51 to create a double turn. In one embodiment of crossover 60, lead 61-1 (not shown) is coupled to lead 261-1 without coupling leads 61-2 and 261-2. Some embodiments of the present invention include additional turns similar or identical to turn 50 and 51 and additional instances of crossover 60 that includes leads, thereby creating N-turn ring 1. Each of the additional turns and leads has a width $T_{50}$ and a thickness that exceeds the London penetration depth $\lambda_L$ of the superconducting material used to make the turns. The N-turn ring structure, such as two-turn ring 200 (FIG. 2D), can be used as a static magnetic flux source.

Because of the superconducting properties of N-turn ring 1, the magnetic flux enclosed by N-turn ring $\lambda_L$ is quantized in multiples of h/N2e, where N is the number of times an inaccessible region is encircled by the N-turn ring, h is Plank's constant, and e is elementary charge. Thus, the magnetic flux stored in N-turn ring 1 is $\Phi = n/N\ \Phi_0$, where n is equal to or greater than one, and N is the number of turns (e.g., number of crossovers 60) in the structure.

In some embodiments, the width $T_{50}$ (FIG. 2A) of each turn in the N-turn ring is greater than the London penetration depth $\lambda_L$ of the material used to make the individual turns in the N-turn ring. In such embodiments, the magnetic flux stored in the aperture 49 (FIG. 2C) of the N-turn ring can be trapped because it cannot penetrate through the N-turn ring when the N-turn ring is in a superconducting state. Escape of the magnetic flux is possible when the superconductivity is broken in a global fashion. One method for breaking the superconductivity of N-turn ring 1 such that it will no longer trap magnetic flux is to raise the temperature of the ring above the critical temperature $T_C$ of the material used to make the individual turns in the N-turn ring. However, in some applications, raising the temperature of the N-turn ring 1 is not practical. For example, such an approach is unpractical when the N-turn ring 1 is used in a device in which other components must remain below the $T_C$ of the material used to make N-turn ring 1. Furthermore, such an approach is unpractical in applications where the length of time that it takes to release the magnetic flux trapped by the N-turn ring 1 is critical (e.g., must be done quicker than the thermal transition rates of the system allow).

The approach of adjusting the temperature of N-turn ring 1 finds useful application when it is desirable to adjust the amount of flux that is trapped in N-turn ring. For example, in one embodiment of the present invention, the N-turn ring comprises at least one turn made of a first superconducting material having a critical temperature $T_{c1}$ and a at least one turn made of a second superconducting material having a critical temperature $T_{c2}$ where $T_{c2}$ is different than $T_{c1}$. In such embodiments, it is possible to adjust the amount of magnetic flux trapped by the N-turn ring by adjusting the temperature of the N-turn ring. For example, consider the case in which the N-turn ring comprises exactly one turn having a critical temperature $T_{c1}$ and exactly turn having a critical temperature of $Tc_2$. A magnetic flux is applied to the N-turn ring and then the N-turn ring is cooled to a temperature $T_A$, where $T_{c1} < T_A < T_{c2}$. Thus, upon cooling to temperature $T_A$, the N-turn ring traps one flux quantum (h/N2e, where N is equal to one) because only one of the turns is superconducting. Then, at a later time, when it desired to reduce the magnetic flux trapped by the N-turn ring, the system is cooled to $T_B$, where $T_B$ is less than $T_{c1}$ and $T_{c2}$. At such a point, both turns become superconducting and the N-turn ring traps only one half of a fluxon (0.5×h/2e).

Due to the disadvantages of relying on raising the temperature of N-turn ring above the $T_c$ for the ring, one aspect of the present invention provides an alternative method for releasing magnetic flux trapped in aperture 49 (FIG. 2A). This aspect of the invention uses switching device 2 to break the superconductivity of each turn in N-turn ring 1. In one embodiment, switching device 2 is capable of introducing a reversible topological cut into each turn in N-turn ring 1. There are many devices that are capable of serving as switching device 2, and all such devices are within the scope of the present invention. Such switching devices include, but are not limited to, a cryotron, a Josephson junction, and a laser. These devices are switchable (e.g., can introduce a reversible localized cut in the superconductivity of a turn in an N-turn ring) and can be used to permit flux in aperture 49 to escape or flux outside of two-turn ring 200 to enter.

Referring to FIG. 2D, the overall dimensions of an N-turn ring 1, such as two-turn ring 200, are dependent upon the physical properties of the material used to make the turns in the N-turn ring. In one embodiment, the total area occupied by a turn (e.g., turn 50 or turn 51) in N-turn ring 1 is less than the square of the coherence length of the material used to make each turn. Coherence length is the smallest dimension over which superconductivity can be established or destroyed in a given superconductor. The coherence length of turns in N-turn ring 1 depend on the type of material used to make each turn in the N-turn ring as well as the purity of such material. For example, the addition of impurities to a metal can cause the coherence length of the metal to decrease. The coherence length of some superconducting materials are as follows tin (30 nm), aluminum (1600 nm), lead (83 nm), cadmium (760 nm), and niobium (38 nm). Thus, in the case where a turn in N-turn ring 1 is made of pure niobium, the turn can occupy an area that is no larger than 1444 $nm^2$, in accordance with one embodiment of the present invention. In some embodiments, the total area occupied by a turn (e.g., turn 50 or turn 51) in N-turn ring 1 is less than the square of the coherence length of the superconducting material used to make each turn and the width $T_{50}$ (FIG. 2A) of each turn is less than the London penetration depth $\lambda_L$ of the superconducting material.

In some embodiments of the present invention, N-turn ring 1 is a mesoscopic system. A mesoscopic system is one that is described by quantum mechanical principles rather than classical mechanical principles. Mesoscopic systems are non-microscopic because they consist of many atoms. The term mesoscopic is a well used term in the field of physics and, in general, indicates a device of physical dimension such that phenomena observed on the structure require quantum mechanical explanation. In other words, mesoscopic systems refer to a class of solid systems where the quantum mechanical single particle accurately describes the characteristics of the physical system. In some embodiments, mesoscopic systems are the systems of intermediate size, e.g., macroscopic but small enough (less than or equal to $10^{-4}$ cm). In mesoscopic systems, quantum interference is very important, since at low enough temperatures (<1K) the phase coherence length of quasiparticles ("electrons") exceeds the size of the system. See, for example, Zagoskin, *Quantum Theory of Many-Body Systems*, pp. 19–20, Springer, 1998; and Imry, "Physics of Mesoscopic Systems", in *Directions in Condensed Matter Physics: Memorial Volume in Honor of Shang-Keng Ma*, Grinstein and Mazenko, eds., World Scientific, 1986, which are hereby incorporated by reference in their entireties.

In some embodiments, an N-turn ring 1 is mesoscopic when the respective overall dimensions (overall height, overall length, and overall width) of the N-turn ring are each less than the phase coherence length of the materials used to make the N-turn ring. In some embodiments, an N-turn ring 1 is mesoscopic when it has respective overall dimensions (height, length, width) of about $10^{-6}$ meters or less, is cooled to a temperature below the critical temperature of the superconducting materials used to make the N-turn ring, and has overall dimensions that are respectively smaller than the phase coherence length of charges in the N-turn ring.

Description and Fabrication of Selected Switching Devices 2

Figure 3A:
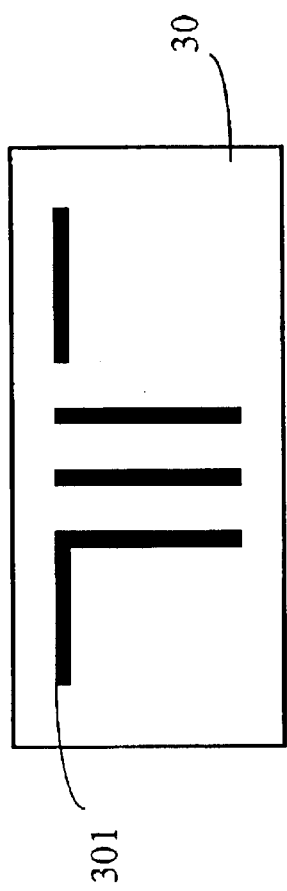
FIGS. 3A–3G illustrate various devices (cyclotron, FIGS. 3A–3C; Josephson junction, FIGS. 3D–3F; and laser, FIG. 3G) that can locally break the superconducting current in a superconducting material, in accordance with embodiments of the present invention.
Figure 3B:
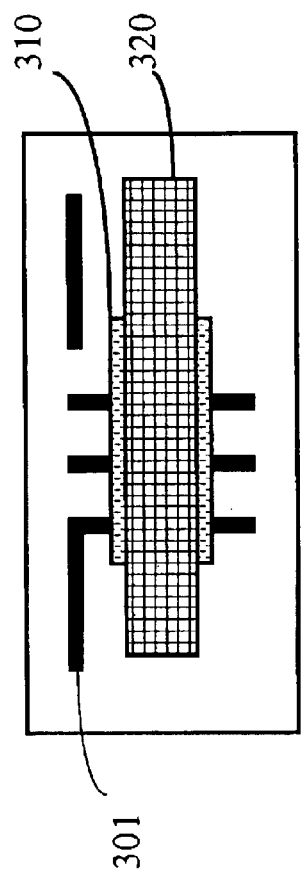
Figure 3C:
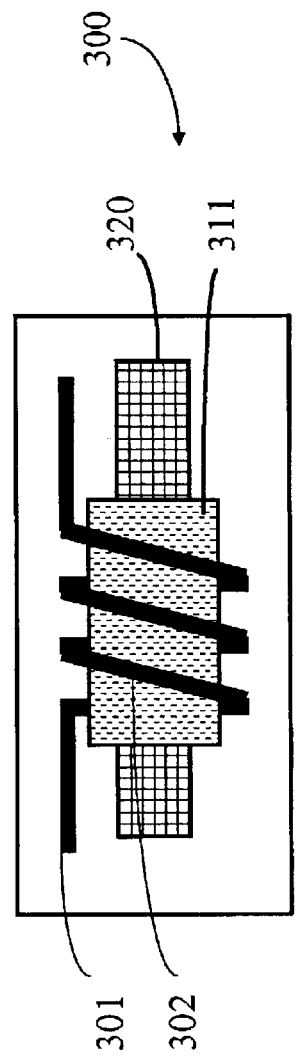

One switching device 2 that can be used to break the superconductivity of one or more rings in N-turn ring 1 is a cryotron. FIGS. 3A–3C detail a method used to fabricate an exemplary cryotron. The exemplary cryotron includes outer layers and intermediate insulating layers. The outer layers form coils that conduct current while the insulating intermediate layers are positioned around the one or more rings in N-turn ring 1. When a current of sufficient size is run through the outer layers of the cryotron, the magnetic field inductively generated at the center of the cryotron interrupts the superconducting current in the one or more rings of N-turn ring 1.

Referring to FIG. 3A, on a substrate 30, material is deposited and patterned to form outer layer 301. In some embodiments, it is convenient to have outer layer 301 patterned as strips, as illustrated in FIG. 3A. However, there is no requirement that outer layer 301 be patterned as strips. Preferably, the material used for outer layer 301 is able to conduct electrical current. Therefore, suitable materials for outer layer 301 include semiconducting materials (e.g., silicon, germanium), conducting materials (e.g., copper, silver, and gold), or superconducting materials (e.g., type I superconductors, type II superconductors, gallium, aluminum, indium, tin, lead, niobium, and niobium-tin).

Next, first insulating layer 310 is deposited on a central portion of outer layer 301 (e.g., a central portion of the disjoint pieces that comprise layer 301). After the patterning of first insulator layer 310, the ends of outer layer 301 are exposed, as depicted in FIG. 3B. Next, intermediate layer 320 (FIG. 3B) is deposited on insulator layer 310. In some embodiments, intermediate layer 320 is made from any material used to make outer layer 301, including semiconducting materials (e.g., silicon, germanium), conducting materials (e.g., copper, silver, and gold), or superconducting materials (e.g., type I superconductors, type II superconductors, gallium, aluminum, indium, tin, lead, niobium, and niobium-tin). In some embodiments, layer 320 is patterned into one or more turns of an N-turn ring 1. For example, in some embodiments, intermediate layer 320 comprises layer 50 and/or layer 51 (FIG. 2). Thus, in such embodiments, intermediate layer 320 is typically made from materials such as a type I superconductor (e.g., niobium, aluminum, and lead) or a type II superconductor.

In some embodiments, insulator layer 310 is thick enough to electrically separate outer layer 301 from intermediate layer 320. For instance, in one embodiment, where outer layer 301 and intermediate layer 320 are made from superconducting materials, insulator layer 310 is deeper than the longest superconducting coherence length of the superconducting materials used to make layers 301 and 320. In some embodiments, outer layer 301 and intermediate layer 320 each comprise a single layer of material. In other embodiments, outer layer 301 and intermediate layer 320 each comprise several discrete layers of material.

In FIG. 3C, a second insulator layer 311 is deposited over intermediate layer 320 and patterned using the lithographic techniques described above. The material used to make insulator layers 310 and 311 is dependent upon the physical properties of the material used to make intermediate layer 320. In the case where intermediate layer 320 is made from niobium or aluminum, insulator layers 310 and 311 are typically made of aluminum oxide ($Al_2O_3$). In some embodiments, insulator layers 310 and/or 311 are made from silicon oxide. Further, those of skill in the art will appreciate that insulator layers 310 and 311 can be made from other materials and all such materials are within the scope of the present invention.

Once second insulator layer 311 has been deposited, outer layer 302 is deposited over layer 311. Then outer layer 302 is patterned in such a way as to create, in conjunction with outer layer 301, a multiple winding solenoid around first insulator 310, intermediate layer 320, and second insulator layer 311. Accordingly, outer layer 302 is typically made out of the same materials as outer layer 301. In some embodiments, outer layer 302 has the shape of disjoint strips that connect with the disjoint strips of outer layer 301 to form coils around the insulating and intermediate layers, as illustrated in FIG. 3C. In other embodiments, outer layer 302 has the shape of a single sheet. One of skill in the art will appreciate that other shapes for outer layers 301 and 302 are possible and all such shapes are within the scope of the present invention. Outer layers 301 and 302 together with insulator layers 310 and 311, as pictured in FIG. 3C, form cryotron 300. Cryotron 300 represents one form of switching device 2 that can be used to break the superconductivity of N-turn ring 1.

Now that the methods used to manufacture cryotron 300 have been disclosed in accordance with one embodiment of the present invention, the operation of cryotron 300 will be described. The operation of cryotron 300 includes driving a current through layers 301 and 302 so that a magnetic field is created in the interior of cryotron 300. In the case where intermediate layer 320 is superconducting, the material used to make outer layers 301 and 302 is selected such that layers 301 and 302 conduct a current that exceeds the critical field of intermediate layer 320. The maximum field that can be applied to a superconductor at a given temperature without loss of superconductivity is referred to as the critical field of the superconductor. The critical field varies in type I and type II superconductors. The maximum critical field ($H_C$) in any type I superconductor is about 2000 Gauss (0.2 Tesla), but in type II materials superconductivity can persist to several hundred thousand Gauss ($H_{C2}$). At fields greater than $H_C$ in a Type I superconductor and greater than $H_{c2}$ in a type II superconductor, the superconductor reverts to the normal state and regains its normal state resistance.

Because the critical field of type II materials is so high, intermediate layer 320 (e.g., turns 50 and 51 of FIG. 2) is typically made of a type I superconductor. In the case where intermediate layer 320 is made from Al (or a superconducting material with a similar $H_C$), layers 301 and 302 must conduct enough current to produce a magnetic field that is between 50 Gauss and 500 Gauss. In another example, in the case where intermediate layer 320 is made from Nb (or a superconducting material with a similar $H_C$), layers 301 and 302 must conduct enough current to produce a field of about 2000 Gauss. One Tesla is equal to about $10^4$ Gauss. The conductivity of layers 301 and 302 is determined by their dimensions and the material used to form the layers. The magnetic field produced by layers 301 and 302 is a function of the number of coils that layers 301 and 302 form around intermediate layer 320 and the amount of current in these coils. In one embodiment of the present invention, cryotron 300 is used to introduce local breaks in the superconductivity in select turns in the N-ring 1.

Figure 3D:
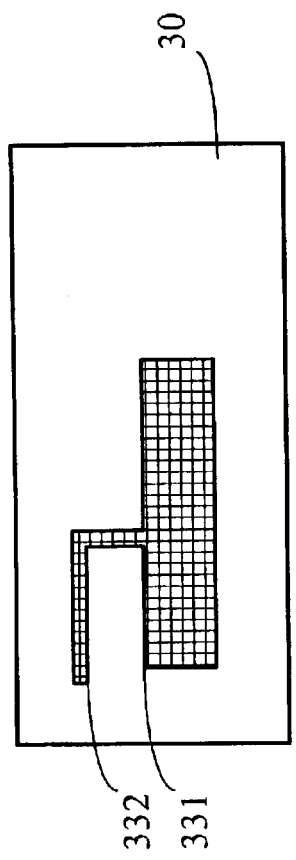
Figure 3E:
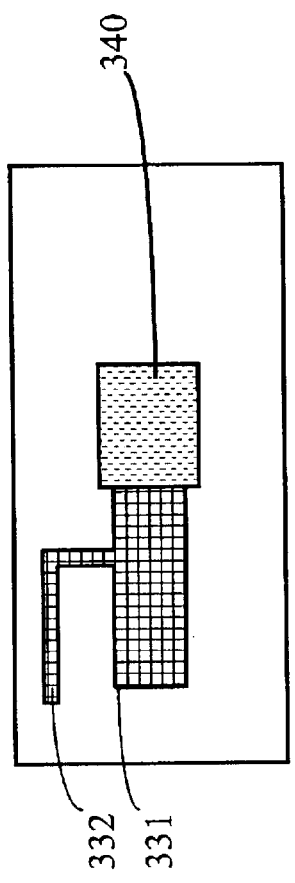
Figure 3F:
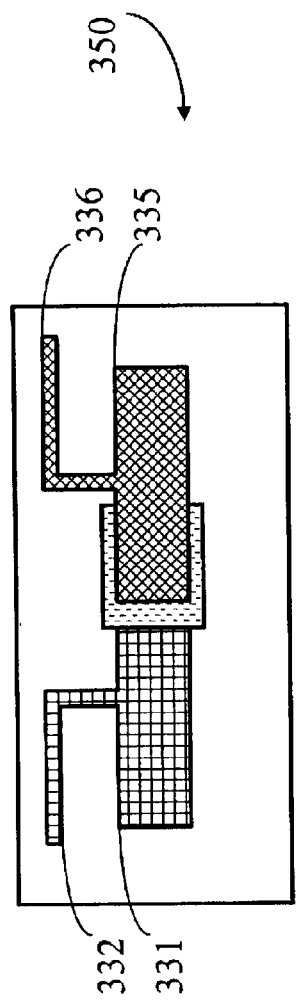

FIGS. 3D–3F describe the manufacture of another switching device 2 that is used in some embodiments of the present invention. In particular, FIGS. 3D–3F describe how Josephson junctions are introduced into one or more turns of N-turn ring 1 in some embodiments of the invention. In FIG. 3D, a superconducting material is deposited onto substrate 40 and patterned into a single piece 331 that includes a biasing lead 332. In some embodiments, piece 331 is a part of a turn in the N-turn ring 1. For example, in some embodiments, piece 331 is part of turns 50 or 51 (FIG. 2).

In FIG. 3E, a material is layered onto a portion of piece 331 to form Josephson layer 340. Many different materials can be used to form Josephson layer 340. In one example, Josephson layer 340 is an insulating layer with a depth that is less than or equal to the coherence length of the superconducting material used to make piece 331. In such embodiments, Josephson layer 340 acts as a tunneling barrier. When Josephson layer 340 is an insulator, the layer is deposited such that it has a depth that is less than approximately the coherence length, ξ, of the superconducting material used to make piece 331. In another embodiment, Josephson layer 340 is formed by using a clean normal metal. In such embodiments, the depth of layer 340 is generally less than the approximate correlation length of the clean normal metal used to form Josephson layer 340. The correlation length of a clean normal metal is $hv_F/kT$, where h is Planck's constant over $2\pi$, $v_F$ is the Fermi velocity of the metal, and kT is the thermal energy. Still other Josephson layers 340 are possible. For example, a dirty normal metal junction with scattering sites could be used to from Josephson layer 340. See Barone and Paternò, *Physics and Applications of the Josephson Effect*, John Wiley & Sons, New York (1982), which is hereby incorporated by reference in its entirety. One of skill in the art will appreciate that still other materials can be used to form Josephson layer 340, and all such materials are within the scope of the present invention.

In FIG. 3F, an additional superconducting piece 335 is deposited onto Josephson layer 340 and patterned to include lead 336. In some embodiments, pieces 331 and 335 are portions of the same turns in N-turn ring 1. Accordingly, in such embodiments, piece 331 is made of the same material as piece 335 (e.g., a type I superconductor). In embodiments where piece 331 and piece 335 are different sections of the same turn in N-ring 1, the net effect of the processing steps illustrated in FIGS. 3D–3F is the introduction of a Josephson junction 350 into the ring.

Josephson junction 350 may be used to locally break the superconductivity of a turn in N-turn ring 1. Generally, a Josephson junction, such as Josephson junction 350, can operate in a zero voltage state or a voltage state. The zero voltage state is a superconducting state whereas the voltage-state is a non-superconducting state. A property of all Josephson junctions is their ability to switch from a zero voltage to a voltage state when the current through the Josephson junction is greater than a critical current $I_C$. To produce such a critical current, leads 332 and 336 are used to introduce a current through Josephson junction 350. When this current exceeds the $I_C$ of layer 340, Josephson junction 350 is toggled from a zero voltage state (superconducting) to a voltage state (nonsuperconducting). Therefore, Josephson junction introduces a local break in the superconductivity of a turn in N-turn ring 1.

Figure 3G:
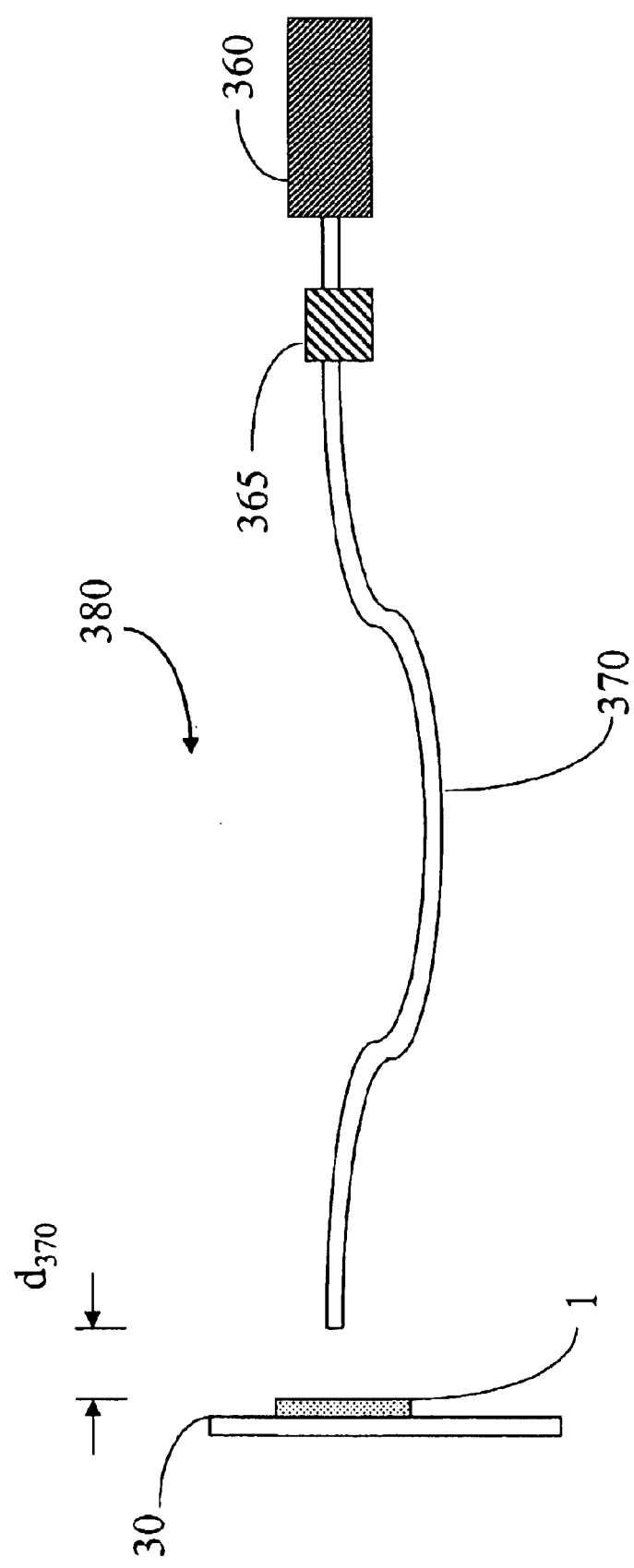

FIG. 3G depicts another switching device 2 (device 375) that can be used to break the superconductivity of one or more turns in N-turn ring 1. Focused electromagnetic radiation, such as light from a laser, applied to a superconductor will break the superconducting current within superconductor. The laser raises the temperature of a localized portion of the N-turn ring 1 above the critical temperature of the ring, thereby interrupting the supercurrent in a localized fashion. This phenomenon is used in system 380. System 380 includes a laser 360. In some embodiments, laser 360 is an infrared (IR) laser. In some embodiments, laser 360 has a wavelength in the range of 0.7 ΦM to about 10 ΦM. In some embodiments, laser 360 is an Alexandrite laser with a wavelength of about 0.72 ΦM a GaAlAs diode laser with a wavelength of about 0.72 ΦM, a Ti-Sapphire laser with a wavelength of about 0.88 ΦM, an InGaAs diode laser with a wavelength of about 0.98 ΦM, a Nd-Yag laser with a wavelength of about 1.06 ΦM, a He-Ne laser with a wavelength of about 1.15 ΦM, an Nd-YLF laser with a wavelength of 1.31 ΦM, or a Nd-YAG laser with a wavelength of about 1.32 ΦM.

In some embodiments, laser 360 has a wavelength in the visible spectrum (0.7 ΦM. to 0.4 ΦM) or ultraviolet spectrum (0.4 ΦM to 0.15 ΦM). However, the heating effect associated with lasers operating in the ultraviolet wavelength range is advantageous and has utility in some embodiments of the present invention. Therefore, lasers operating in the ultraviolet wavelength range are more commonly used in systems 380 in accordance with the present invention.

In some embodiments, laser 360 is a pulsed laser. In some embodiments, the pulse duration of laser 360 is 100 femtoseconds, 50 femtoseconds, 10 femtoseconds, 5 femtoseconds, 1 femtosecond, or less. In some embodiments, laser 360 has a wavelength of about one micron 1 ΦM and a pulse duration of about 10 femtoseconds or less. In some embodiments, laser 360 has a pulse duration that is about the length of the magnetic diffusion time of N-turn ring 1. The magnetic diffusion time for a conductor such as N-turn ring 1 is the amount of time needed to annihilate a field inside the conductor. The magnetic diffusion time is dependent on the conducting material and the dimensions (size) of the material. Pulse durations that approximate or exceed the magnetic diffusion time of N-turn ring 1 are desirable because they insure that the supercurrent is interrupted for a sufficiently long time to create or annihilate the flux trapped inside the ring.

Referring to FIG. 3G, laser 360 is directed down waveguide 370 and projected onto a superconducting structure, such as two-turn ring 200 (see FIG. 2D). The electromagnetic radiation travelling down waveguide 370 can be modulated by an optional switch 365. Examples of switches 365 are well known in the art. In some embodiments, waveguide 370 comprises a plurality of waveguides and modulating switch 365 acts as a distributor of the electromagnetic radiation (not shown). This plurality of waveguides can be directed on to different portions of two-turn ring 200.

In system 380, waveguide 370 terminates at a distance $d_{370}$ away from a region of two-turn ring 200. The distance $d_{370}$ can be a distance of zero to several centimeters or more. Those of skill in the art will appreciate that, at larger distances, such as several centimeters, a precision optical system between waveguide 370 and two-turn ring 200 can be used to align the waveguide with specific regions of N-turn ring 1.

Sub-flux Quantum Generator 400

Figure 4A:
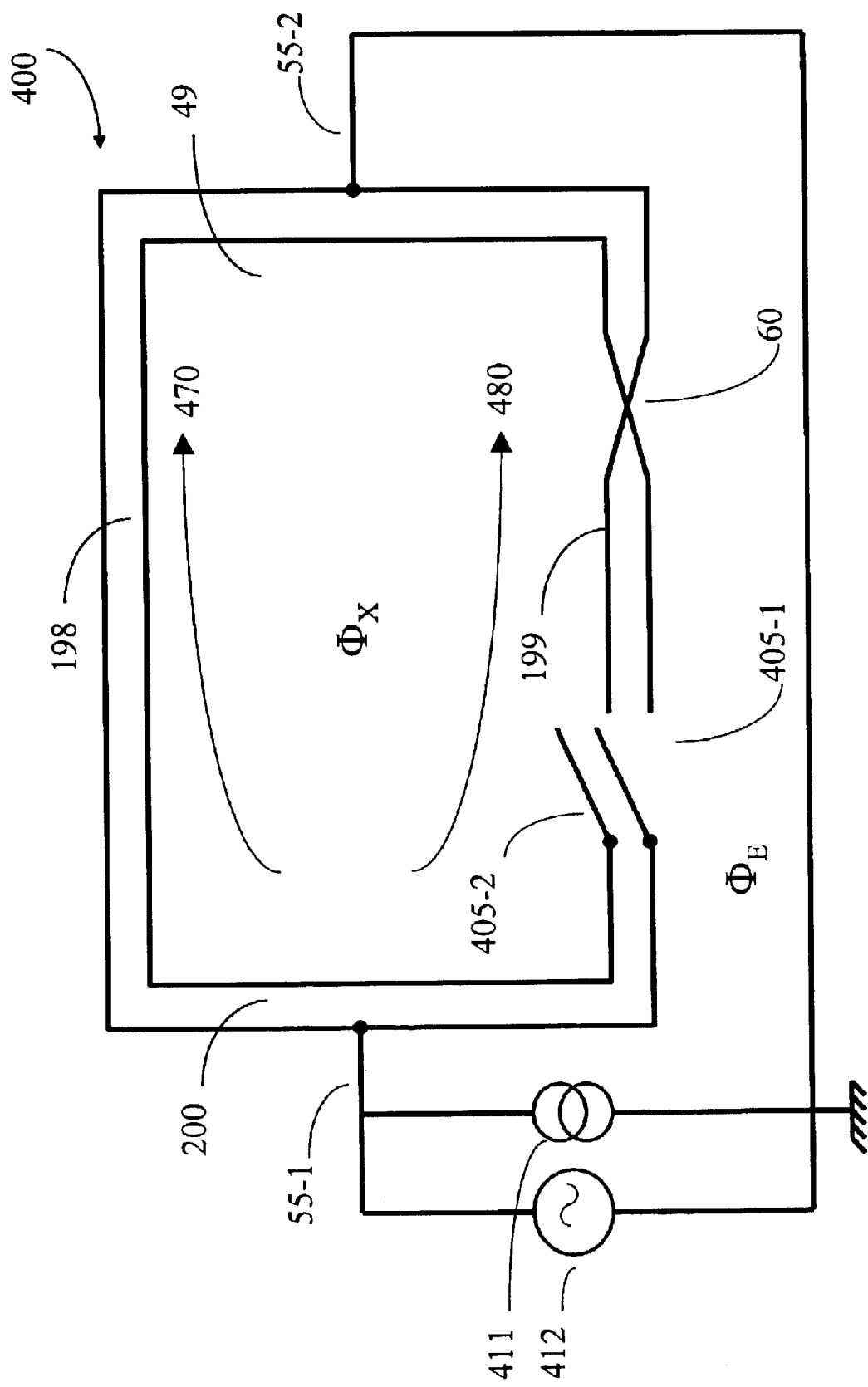
FIGS. 4A–4C illustrate sub-flux quantum generators in accordance with various embodiments of the present invention.

FIG. 4A illustrates a device 400 that includes a two-turn ring 200 (exemplary N-turn ring 1, FIG. 1), switching devices 405 to break the superconductivity of ring 200 (exemplary switching device 2, FIG. 1), and a magnetic flux source 412 (exemplary magnetism device 3, FIG. 1). In FIG. 4A, two-turn ring 200 is incorporated into device 400 through leads 55. Examples of switches 405 include, but are not limited to, a cryotron 300 (FIG. 3C), a Josephson junction 350 (FIG. 3F), and a laser 375 (FIG. 3G). In the example illustrated in FIG. 4A, switch 405 is placed in each turn of a two-turn ring.

An alternating current source 412 (magnetic flux source 3) and a direct current source 411 are arranged parallel and are in electrical communication with two-turn ring 200 in order to create a supercurrent through two-turn ring 200. In state 1, switches 405 allow current to flow and supercurrent travels equally through both turns of two-turn ring 200. Similarly, when two-turn ring 200 is replaced with a generalized N-turn ring, current flows through each turn of the N-turn ring. Further, the current flows equally through both possible paths (paths 470 and 480) of the ring from 55-1 to 55-2. Thus, there is a direct connection 198 (path 480) and an indirect connection 199 (path 470) through crossover 60. In the embodiment illustrated in FIG. 4A, two-turn ring 200 includes crossover 60. Because the current in paths 470 and 480 are equal and flowing in opposite directions, no magnetic field is induced in aperture 49 during initial state 1.

In state 2, switches 405 are set to block the flow of current. As a result, the superconducting current that was flowing in path 480 in state 1 is terminated. Supercurrent can only travel through connection 198 of ring 200 (path 470) because connection 198 does not include the localized break induced by switches 405. As a result, the symmetry between the superconducting current following paths 470 and 480 is lost and, therefore, a net magnetic flux $\Phi_x$ is induced into aperture 49 during state 2. In state 3, the symmetrical superconducting current is restored to two-turn ring 200 by closing switches 405, allowing current to flow through connection 199 (path 480). In a typical embodiment, each turn in two-turn ring 200 has a width $T_{50}$ (FIG. 2A) that exceeds the London penetration depth $\lambda_L$ of the material used to make device 200. Therefore, the magnetic flux that arose in aperture 49 during state 2 is trapped and quantized during state 3. In this example, the amount of magnetic flux that is trapped in aperture 49 ($\Phi_x$) is $n/2\Phi_0$, where the integer n is controlled by the amount of supercurrent conducted through 2-turn ring 200, and the value 2 is found in the equation for the $\Phi_x$ of two-turn ring 200 because there are two turns in device 200. In general, the induced magnetic flux is equal to the product of the electrical current flowing in device 200 during state 2 and the self-inductance of device 200. When the current is not superconducting, the induced magnetic flux can take any value. However, when device 200 becomes superconducting, the magnetic flux becomes quantized. For this reason, the magnetic flux that is trapped in aperture 49 ($\Phi_x$) is $n/2\Phi_0$.

The rate at which flux can be introduced into aperture 49 is application dependent. In the embodiment illustrated in FIG. 4, the rate is approximately equal to $\tau_m$ the magnetic diffusion time $\tau_{m \sim \mu_0} \cdot \sigma \cdot L^2$ where $\mu_0$ is the permeability of free space, $\sigma$ is the normal conductivity of superconducting material 50 and L is proportional to the mean width of two-turn ring 200.

Sub-flux Quantum Generator 401

Figure 4B:
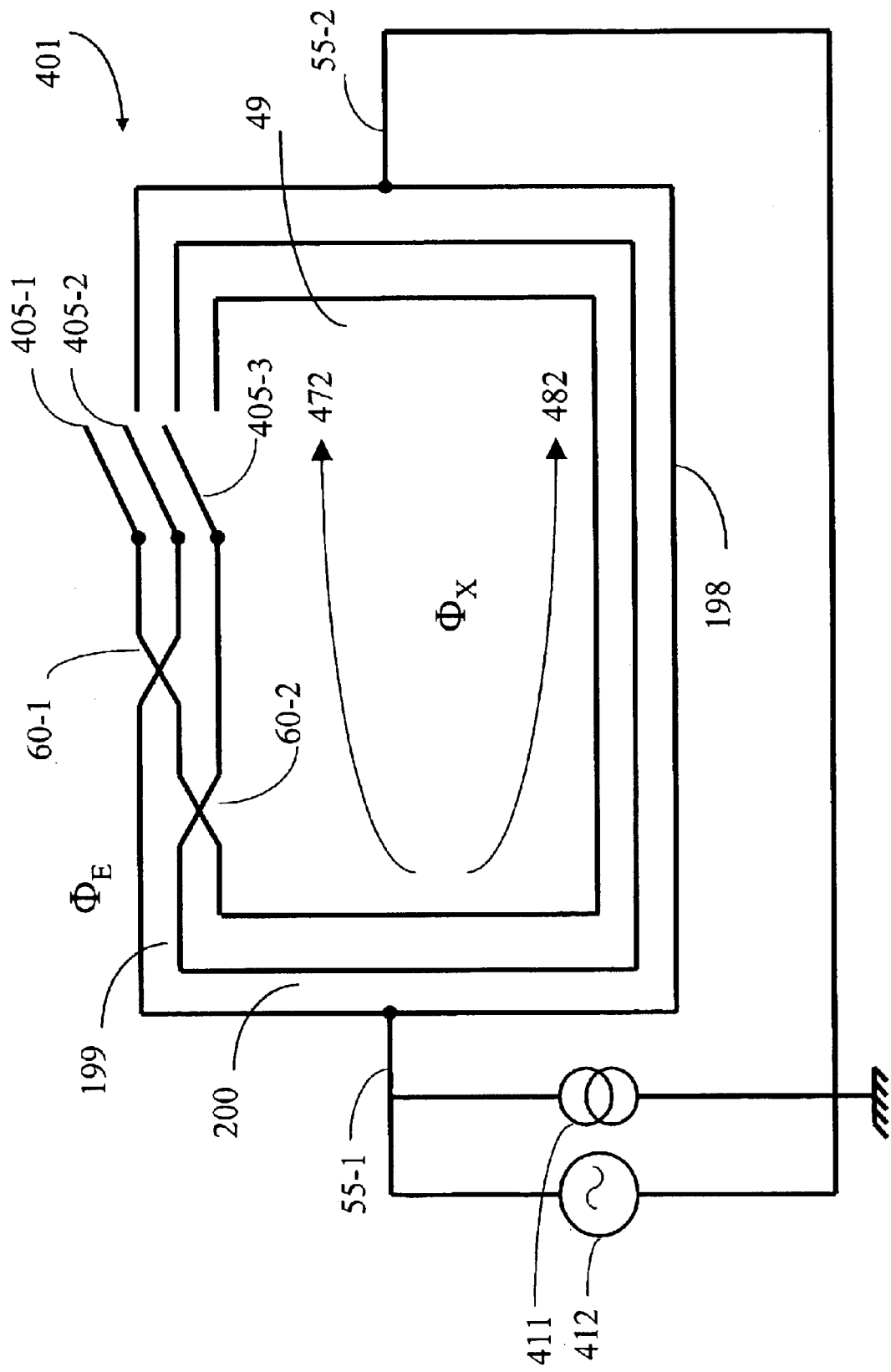

FIG. 4B illustrates another sub-flux source in accordance with the present invention. Sub-flux quantum generator 401 includes a two-turn ring 200 that is a variant of the two-turn ring 200 illustrated in FIG. 4A. The two-turn ring illustrated in FIG. 4B includes two crossovers 60 and three switches 405 (switching devices 2). Operation of sub-flux quantum generator 401 is similar to that of sub-flux quantum generator 400. It is possible to trap a flux $\Phi_x$ in two-turn ring 200. This magnetic flux can be established in aperture 49 even when an external flux $\Phi_E$ (not shown) is present.

In state 1, for sub-flux quantum generator 401, switches 405 allow current to flow and supercurrent travels equally through all turns of three-turn ring 200 which may be replaced by an N turn ring. Further, the current flows equally through both possible paths (472 and 482) of ring 200 from 55-1 to 55-2. There is a direct connection 198 (path 482) and an indirect connection 199 (path 472) through crossovers 60-1 and 60-2. Because the current in paths 472 and 482 are equal and flowing in the same principle direction, no magnetic field is induced in aperture 49 during initial state 1.

In state 2, switches 405 no longer allow current to flow and the superconducting current that was flowing through path 470 in state 1 is blocked by switches 405-1, 405-2, and 405-3. Current must flow through direct connection 198 (path 482). As a result, the symmetry between the current flowing in paths 472 and 482 that existed in state 1 is lost and, therefore, a magnetic flux $\Phi_x$ is induced into aperture 49 during state 2. In state 3, the symmetrical superconducting current is restored to two-turn ring 200 by closing switches 405, allowing current to flow along path 472 (through connection 199). In a typical embodiment, each turn in an N-turn ring 200 has a width $T_{50}$ (FIG. 2A) that exceeds the London penetration depth $\lambda_L$ of the material used to make device 200. Therefore, the magnetic flux that arose in aperture 49 during state 2 is trapped and quantized during state 3. In this example, the amount of magnetic flux that is trapped in aperture 49 ($\Phi_x$) is n/3$\Phi_0$, where the integer n is controlled by the amount of supercurrent conducted through 3-turn ring 200, and the value 3 is found in the equation for the $\Phi_x$ of three-turn ring 200 because there are three rings in device 200. The rate at which flux can be introduced into aperture 49 is application dependent. In the embodiment illustrated in FIG. 4, the rate is approximately equal to $\tau_m$ the magnetic diffusion time $\tau_m \approx \mu_0 \cdot \sigma \cdot L^2$ where $\mu_0$ is the permeability of free space, $\sigma$ is the normal conductivity of superconducting material 50 and L is proportional the mean width of two-turn ring 200.

Sub-flux Quantum Generator 402

Figure 4C:
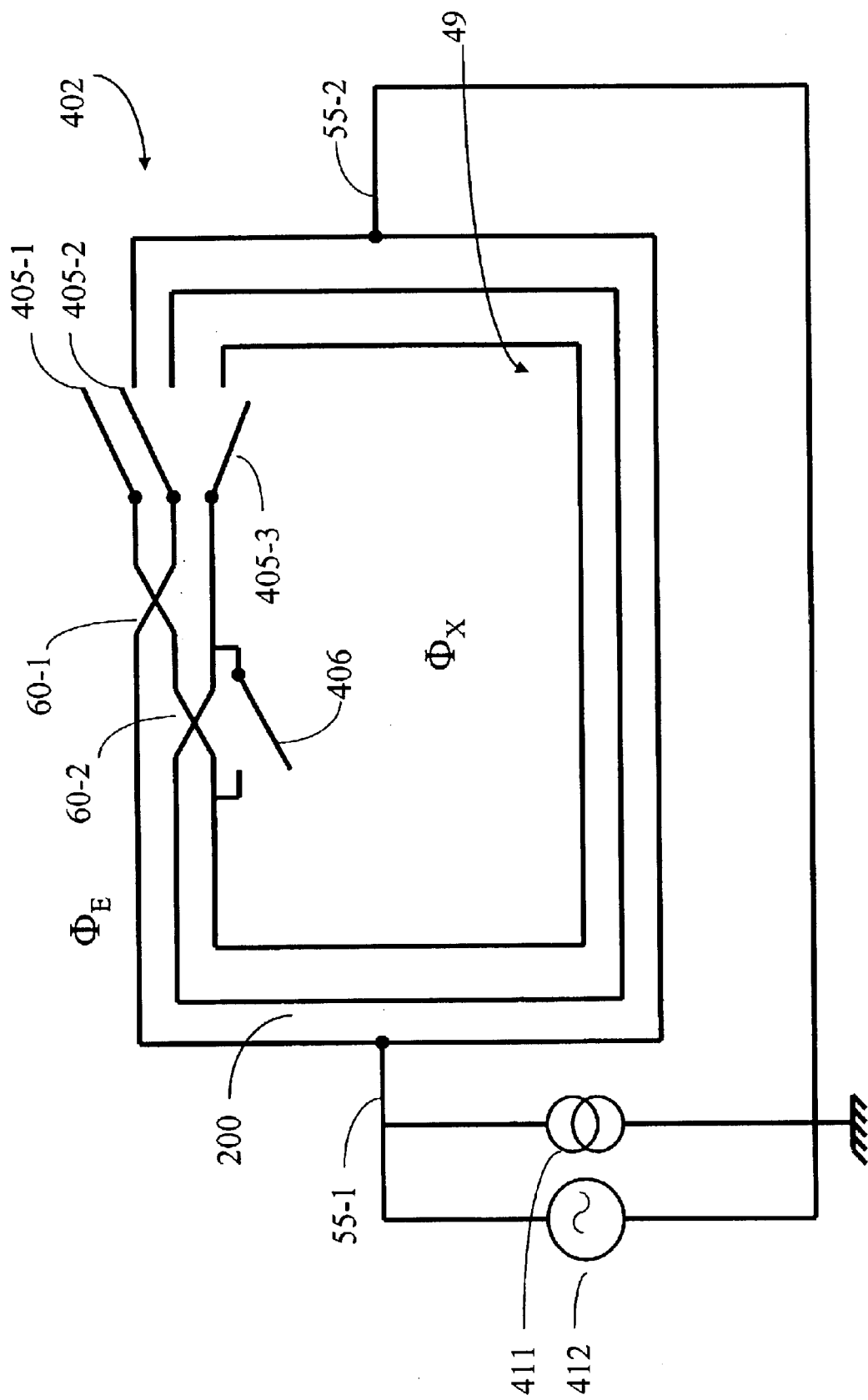

FIG. 4C illustrates another sub-flux quantum generator (402) in accordance with an embodiment of the present invention. Sub-flux quantum generator 402 includes an N-turn ring 200 and a switch 406 that shunts crossover 60-2 in N-turn ring 200. Operation of sub-flux quantum generator 402 differs from that of sub-flux quantum generators 400 (FIG. 4A) and 401 (FIG. 4B). In particular, the number of turns in N-turn ring 1 may be adjusted by operation of switch 406.

Magnetic flux in sub-flux quantum generator 402 is trapped by progression through the following states. In state 1, switches 405 in the rings of N-turn ring 200 in which magnetic flux is to be trapped are opened. A current is driven through N-turn ring 200, establishing magnetic flux $\Phi_x$ in aperture 49. In state 2, the magnetic flux is trapped in aperture 49 by closing switches 405 in specific rings of N-turn ring 1. The amount of magnetic flux trapped in state 2 is a function of the number of switches 405 closed, the state of shunting switch 406, and the amount of current flowing through N-turn ring 1 when switches 405 were closed. For example if a flux $\Phi_x$=n/2 $\Phi_0$ is desired, switches 405-1, 405-2 and 406 are closed in state 2 while switch 405-3 remains open. When switches 405 and 406 are in this configuration, the magnetic flux is enclosed in a two-turn superconducting ring. Therefore, the magnetic flux assumes the quantized value of $\Phi_x$=n/2 $\Phi_0$. In the expression for $\Phi_x$, the value n is a function of current driven through N-turn ring 1, and the value 2 in denominator arises because there are two turns in the N-turn ring.

Sub-flux quantum generator 402 can be used to trap magnetic flux $\Phi_x$ having the quantized value n/3 $\Phi_0$ by progression through the following states. First, switches 405-1, 405-2, and 405-3 are opened. A current is driven through N-turn ring 200, establishing magnetic flux $\Phi_x$ in aperture 49. Then switch 406 is opened and switches 405-1, 405-2, and 405-3 are closed. Leaving switch 406 open activates crossover 60-2 and opens up a third superconducting ring around aperture 49. As a result, the amount of magnetic flux that is trapped by aperture 49 is n/3 $\Phi_0$.

One of skill in the art will appreciate that the sub-flux quantum generator 402 could be modified to have N rings and at least N-1 crossovers, where N is any integer greater than 2. Further, shunt switches could be placed across any number of the at least N-1 crossovers. In this way, a sub-flux quantum generator that is capable of trapping a magnetic flux $\Phi_x$=n/N $\Phi_0$ is realized, where N is determined by the configuration of the switches 405 and shunt switches 406 (not shown) in the N-turn ring 1. Such devices can be used as calibration units for magnetometers. Since the value of the flux $\Phi_x$ can be accurately determined, the device can be used to check the accuracy and precision of any device that senses magnetic flux. Devices that sense magnetic flux include a superconducting quantum interference device (SQUID) and a magnetic force microscope (MFM).

Sub-flux Quantum Generator 500

Figure 5:
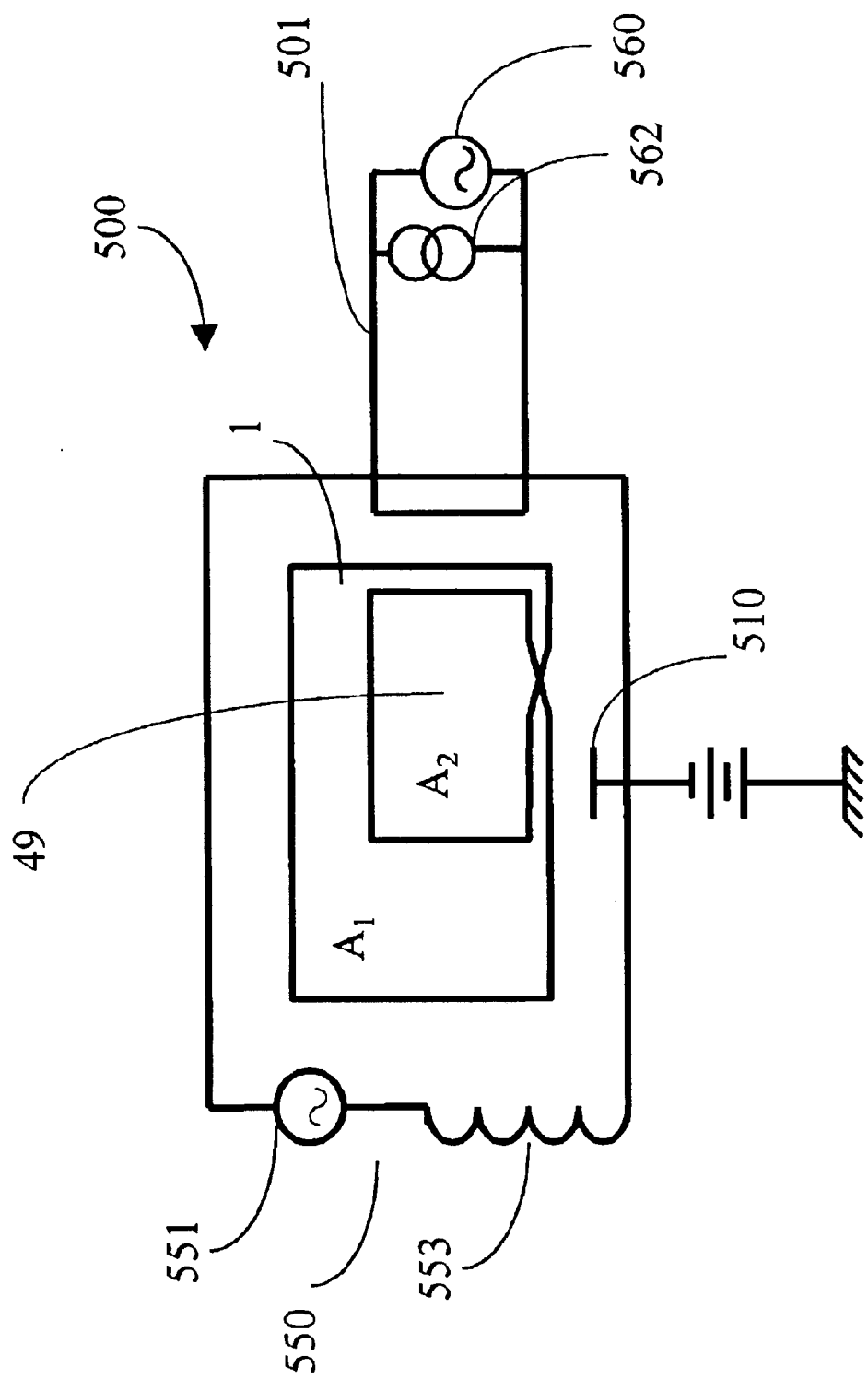
FIG. 5 illustrates a sub-flux quantum generator in which each turn in an N-turn ring encloses a different amount of area, in accordance with one embodiment of the present invention.

FIG. 5 illustrates a sub-flux quantum generator 500 in accordance with another embodiment of the present invention. Previously, it has been disclosed that the amount of magnetic flux trapped by an N-turn superconducting ring is quantized into some multiple of h/N2e, where N is the number of turns in the N-turn ring. This relationship assumes that the area within each turn in the N-turn ring is approximately the same. In sub-flux quantum generator 500, at least one turn in the N-turn ring 1 encloses an area $A_1$ that is larger or smaller than the area $A_2$ enclosed by another turn in the N-turn ring. Thus, although the N-turn ring 1 in sub-flux quantum generator still traps a quantized amount of magnetic flux when in the superconducting state, the amount of magnetic flux trapped by the N-turn ring 1 is not governed by the expression h/N2e. In fact, the amount of magnetic flux stored by N-turn ring 1 can be adjusted by varying the size of individual rings in the N-turn ring 1. In the embodiment illustrated in FIG. 5, for example, N-turn ring 1 has two turns. The outer turn encloses area $A_1$ and the inner turn encloses area $A_2$. Here, the two-turn ring traps magnetic flux at quantized values that diverge from n/2 $\Phi_0$, where n is a natural number, because each turn encloses a different area. Thus, the amount of magnetic flux that the N-turn ring traps in sub-flux quantum generator 500 can be modified by adjusting the size of each turn of the N-turn ring.

In some embodiments, it is desirable to introduce an inhomogeneous magnetic field into N-turn ring 1. An inhomogeneous magnetic field is one that varies in magnitude as a function of position within aperture 49 (e.g., the magnetic field has a gradient in at least one direction within aperture 49).

Thus, an inhomogeneous magnetic field in the case of the N-turn ring 1 arises when the magnitude of the trapped magnetic flux within aperture 49 (FIG. 5) of the N-turn ring varies as a function of position. FIG. 5 illustrates how an inhomogeneous magnetic field within aperture 49 can be achieved. FIG. 5 includes a magnetic flux source 550 that includes a current source 551 and an inductor 553. In FIG. 5, current source 551 is used to drive a current through N-turn ring 1. Devices (not shown in FIG. 5) such as cryotrons 300 (FIG. 3C), Josephson junctions 350 (FIG. 3F), and/or laser systems 380 are used to break the superconducting current at localized positions of the turns in N-turn ring 1. At a later stage these localized breaks are restored in order to trap magnetic flux in the aperture of the N-turn ring using the techniques described above for other embodiments of the present invention. In FIG. 5, a magnetic field within aperture 49 that is inhomogeneous is produced using additional flux generator 501. Current in 501, from alternating current source 560 and direct current source 562, produces a magnetic flux in aperture 49. The magnitude of this flux at any given point in aperture 49 is inversely dependent on the distance between the point in aperture 49 and the current in 501. Other geometrical configurations of 501 are possible. Additional flux generator 501 includes an alternating current source 560 that is configured to provide a magnetic field at a different angle than the flux that is enclosed within the N-turn ring. This is accomplished by providing a wire adjacent to the ring 1 out of the plane of the ring. Using current sources 560 and 562 a current in 501 will provide a flux that is not normal to the plane of 1. Further, flux generator 500 can include a charge source 562 that makes the magnetic field in the N-turnring inhomogeneous. FIG. 5 illustrates another device that can be used to make the magnetic field in an N-turn ring inhomogeneous. The device is capacitor 510, which is capable of bending the magnetic field within the ring.

Use of sub-flux Quantum Generators to Bias Persistent Current Qubits

Figure 6:
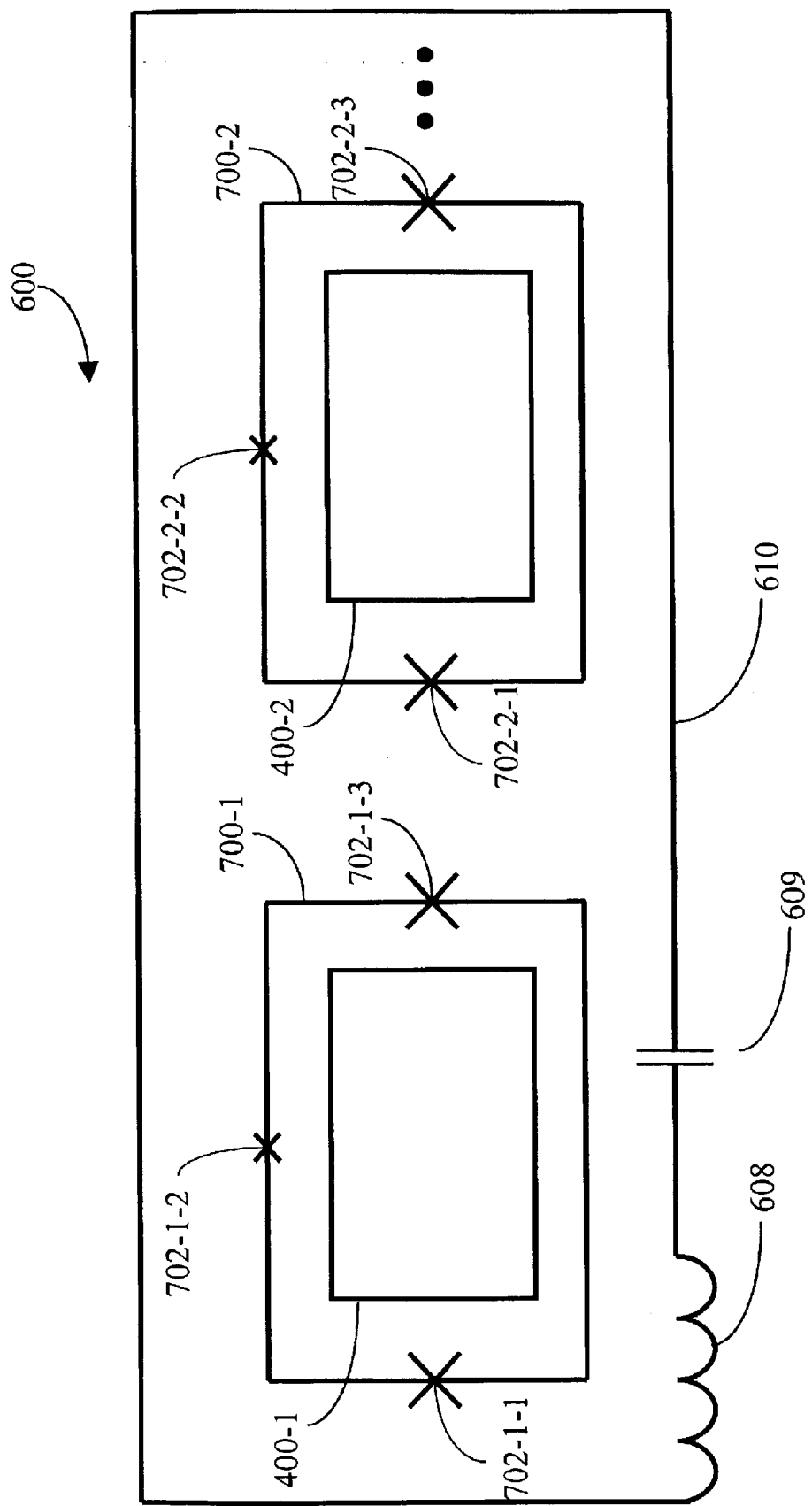
FIG. 6 illustrates an array of persistent current qubits that are each biased by a sub-flux quantum generator, in accordance with one embodiment of the present invention.
Figure 7:
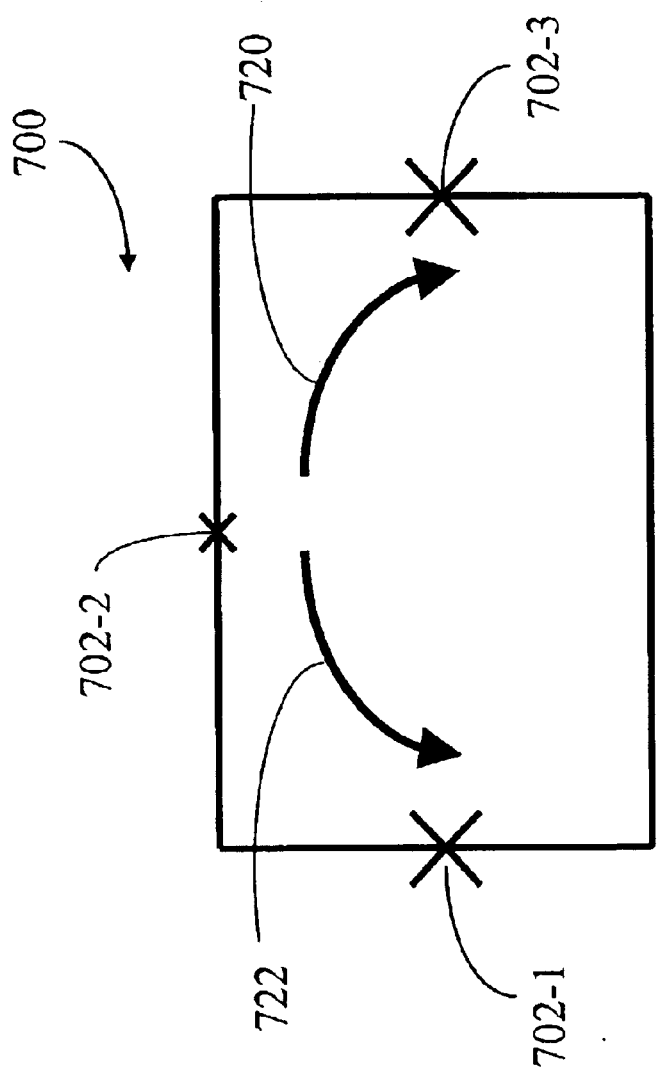
FIG. 7 illustrates a persistent current qubit in accordance with the prior art.
Figure 8:
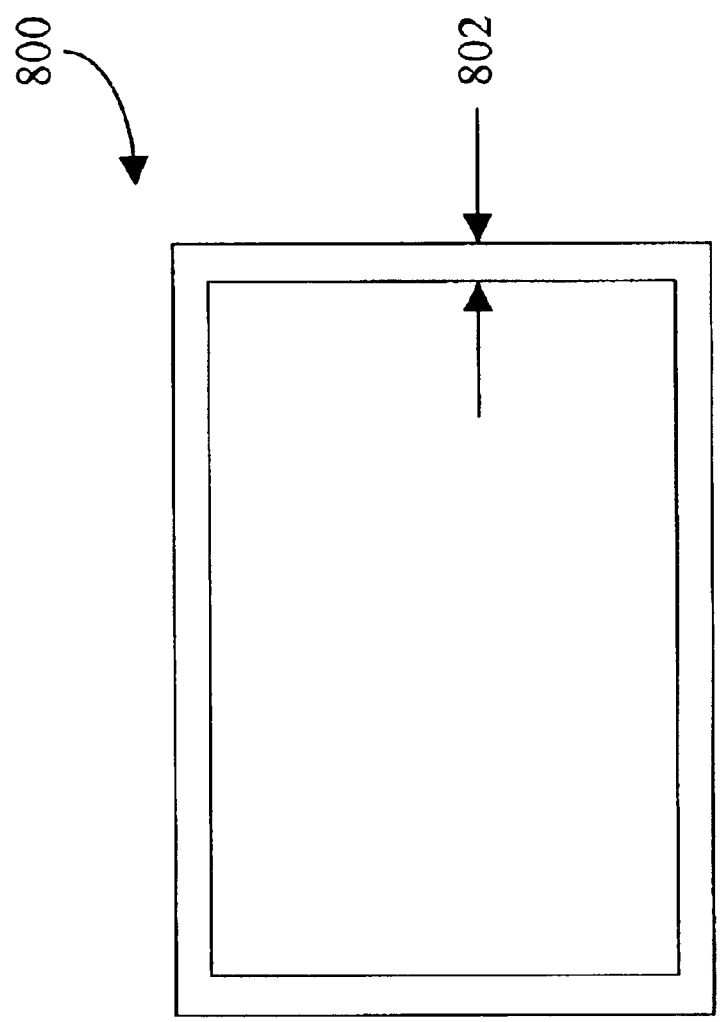
FIG. 8 illustrates a mesoscopic ring in accordance with the prior art.

FIG. 6 illustrates an embodiment of the present invention in which a sub-flux quantum generator is used to frustrate a superconducting structure. An example of a superconducting structure is a superconducting qubit, such as a persistent current qubit 700. As described above, persistent current qubit 700 (FIG. 6, FIG. 7) comprises a superconducting loop that has at least three Josephson junctions 702. The Josephson energy of two of the junctions 702 is equal while the Josephson energy of the third junction 702 is slightly less than the other two junctions. In FIG. 6, the presence of a Josephson junction 702 is indicated by an "X". The size of the "X" used to label each Josephson junction 702 is proportional to the Josephson energy of the respective junction.

In FIG. 6, each sub-flux quantum generator in 400 is used to bias a persistent current qubit 700 so that the two stable energy states of the qubit become degenerate (i.e., have equal energy). These degenerate states correspond to quantum phase states of persistent current qubit 700. Using these states, which may be ground states of persistent current qubit 700, it is possible to perform quantum computation operations. Those of skill in the art will appreciate that, in some embodiments, it is necessary to shield the persistent current qubit from leads 55 (FIG. 4A).

In additional embodiments of the present invention, a sub-flux quantum generator is used to bias any superconducting qubit, such as phase qubits and/or charge qubits and/or hybrid qubits. Qubits are defined by their uncertainty in charge and phase, which is, in turn, determined by the Heisenberg uncertainty principle. The Heisenberg uncertainty principle can be expressed as $\Delta n \Delta \phi \geq 1/2$, where $\Delta n$ represents an uncertainty in the charge of the qubit and $\Delta \phi$ represents an uncertainty in the phase of the qubit. There are two classic types of qubits, charge qubits and phase qubits. In a charge qubit, the uncertainty of the phase of the qubit is large compared to the uncertainty of the charge. In a phase qubit, uncertainty of the charge of the qubit is large compared to the uncertainty of the phase. When a qubit is in the charge regime, the charge of the charge device represents a good quantum number and has a finite number of charge states. A good quantum number in this case means a small-uncertainty in its charge. See, e.g., Nakamura et al., 1999, Nature 398, p. 786, which is hereby incorporated by reference. When a qubit is in the phase regime, the phase of a mesoscopic phase device is a good quantum number (to the extent that the uncertainty is small) having a finite number of phase states. A hybrid qubit is a qubit that has neither a charge nor a phase as a good quantum number. An example of a hybrid qubit is a quantronium. See, for example, Cottet et al., 2002, Physica C 367, pp. 197–203; and Vion et al., 2002, Science 296, pp. 886, which are hereby incorporated by reference in their entireties.

Further, one or more sub-flux quantum generators can be used to frustrate (bias) a superconducting structure, such as a qubit. In some embodiments, the frustration is used to create degenerate states as in the case illustrated in FIG. 6. In other embodiments, this frustration need not create degenerate states. Rather, the frustration can be used to bias two stable states of the superconducting structure so that they have a predetermined energy differential. A case where the use of non-degenerate stable states is useful is described in Lidar et al., 2002, "Quantum Codes for Simplifying Design and Suppressing Decoherence in Superconducting Phase-Qubits," Quantum Information Processing 1, p. 155, also published as LANL preprint ArXiv.org:cond-mat/0204153 (2002), which is hereby incorporated by reference in its entirety.

The embodiment of the present invention depicted in FIG. 6 shows an array of coupled qubits. These qubits (e.g., qubits 601-1 and 601-2) are persistent current qubits and are coupled through an LC-circuit or resonance circuit 610. Here the LC-circuit includes an inductor 608 and a capacitor 609. This pairwise coupling can be repeated in order to couple many pairs of qubits to other pairs of qubits. Such a grouping can serve as a component of a larger quantum-computing device, such as a quantum register or quantum computer.

The operation of persistent current qubit 700 in some quantum computing operations involves applying quantum gates to the qubit. A quantum gate is a controlled interaction between qubits that produces a coherent change in the state of one qubit that is contingent upon the state of another qubit. See, for example DiVincenzo in Braunstein and Lo (eds.), *Scalable Quantum Computers*, Wiley-VCH Verlag GmbH, Berlin (2001); Makhlin et al., 2001, Reviews of Modern Physics 73, p. 357; and Nielsen and Chuang, *Quantum Computation and Quantum Information*, Cambridge University Press, 2000, which are hereby incorporated by reference in their entireties. These gates include a biasing operation that makes one basis state energetically favorable over the other. A method to accomplish such a biasing operation is to provide a flux bias by application of an external magnetic field. Such biasing operations are detailed in Orlando et al., 1999, *Phys. Rev. B* 60, 15398, which is hereby incorporated by reference in its entirety.

Alternative Embodiments

All references cited herein are incorporated herein by reference in their entirety and for all purposes to the same extent as if each individual publication or patent or patent application was specifically and individually indicated to be incorporated by reference in its entirety for all purposes. While the present invention has been described with reference to a few specific embodiments, the description is illustrative of the invention and is not to be construed as limiting the invention. In particular, while various embodiments of the present invention have been described with a two-turn ring, those of skill in the art will appreciate that an N-turn ring, where N is any integer equal to or greater than two, can be used in such embodiments. Various modifications may occur to those skilled in the art without departing from the true spirit and scope of the invention as defined by the appended claims.

What is claimed is:

1. A sub-flux quantum generator comprising:
   an N-turn ring comprising a plurality of connected turns about a common aperture, wherein a width $T_{50}$ of each respective turn in said plurality of connected turns exceeds the London penetration depth of a superconducting material used to make the respective turn;
   a switching device configured to introduce a localized reversible break in a superconducting current in at least one turn in said plurality of connected turns; and
   a magnetism device configured to generate a magnetic field within said common aperture.

2. The sub-flux quantum generator of claim 1, wherein said sub-flux quantum generator further comprises a first lead and a second lead that electrically couple said N-turn ring and said magnetism device such that a current is driven through said N-turn ring by said magnetism device.

3. The sub-flux quantum generator of claim 1 wherein a turn in said plurality of connected turns comprises a type I superconductor.

4. The sub-flux quantum generator of claim 1 wherein a turn in said plurality of connected turns comprises niobium or aluminum.

5. The sub-flux quantum generator of claim 1 where a turn in said plurality of connected turns comprises a type II superconductor.

6. The sub-flux quantum generator of claim 1, wherein said switching device comprises a cryotron that encompasses a portion of one or more of the turns in said plurality of connected turns.

7. The sub-flux quantum generator of claim 1, wherein said switching device is a cryotron that encompasses a portion of each turn in said plurality of connected turns.

8. The sub-flux quantum generator of claim 1, wherein said switching device is a Josephson junction in a turn in said plurality of connected turns and wherein said Josephson junction is in a superconducting zero voltage state or a nonsuperconducting voltage state.

9. The sub-flux quantum generator of claim 8, wherein said Josephson junction comprises a first critical current lead and a second critical current lead for driving a critical current through said Josephson junction and wherein said Josephson junction is in said superconducting zero voltage state in an absence of said critical current; and said Josephson junction is in said nonsuperconducting voltage state in a presence of said critical current.

10. The sub-flux quantum generator of claim 1 wherein said magnetic field is homogeneous within said common aperture.

11. The sub-flux quantum generator of claim 1 wherein said magnetic field is inhomogeneous within said common aperture.

12. The sub-flux quantum generator of claim 1 wherein said magnetic field has a gradient in at least one direction within said common aperture.

13. The sub-flux quantum generator of claim 1, wherein said switching device comprises a laser configured to introduce said localized reversible break in said superconducting current in said at least one said turn in said plurality of connected turns.

14. The sub-flux quantum generator of claim 1 wherein said switching device comprises a plurality of switches, wherein each switch in said plurality of switches is configured to introduce a localized reversible break in a superconducting current in at least one turn in said plurality of connected turns.

15. A superconducting device comprising an outer structure and an inner structure, wherein said outer structure comprises a superconducting ring that encompasses all or a portion of said inner structure, the superconducting ring including a Josephson junction; and said inner structure includes an N-turn ring, said N-turn ring comprising a plurality of connected turns about a common aperture, wherein a width $T_{50}$ of each respective turn in said plurality of connected turns exceeds the London penetration depth of the superconducting material used to make the respective turn.

16. The superconducting structure of claim 15 wherein the outer structure is a qubit.

17. The superconducting structure of claim 15 wherein the outer structure is a phase qubit or a persistent current qubit.

18. The superconducting structure of claim 15 wherein a turn in said plurality of connected turns comprises a type I superconductor.

19. The superconducting structure of claim 15 wherein a turn in said plurality of connected turns comprises niobium or aluminum.

20. The superconducting structure of claim 15 wherein a turn in said plurality of connected turns comprises a type II superconductor.

21. The superconducting structure of claim 15, wherein said inner structure further comprises a switching device configured to introduce a localized reversible break in a superconducting current in at least one turn in said plurality of connected turns.

22. The superconducting structure of claim 21 wherein said switching device is a cryotron.

23. The superconducting structure of claim 22 wherein said cryotron encloses said plurality of connected turns.

24. The superconducting structure of claim 21, wherein said switching device is a Josephson junction in a turn in said plurality of connected turns, and wherein said Josephson junction is in a superconducting zero voltage state or a nonsuperconducting voltage state.

25. The superconducting structure of claim 24, wherein said Josephson junction comprises a first critical current lead and a second critical current lead for driving a critical current through said Josephson junction and wherein said Josephson junction is in said superconducting zero voltage state in an absence of said critical current; and said Josephson junction is in said nonsuperconducting voltage state in a presence of said critical current.

26. The superconducting structure of claim 21, wherein said switching device comprises a laser configured to introduce said localized reversible break in said superconducting current in said at least one turn in said plurality of connected turns.

27. The superconducting structure of claim 15, wherein each respective turn in said plurality of connected turns comprises a Josephson junction that is capable of introducing a localized reversible break in the superconductivity of the respective turn.

28. The superconducting structure of claim 15, wherein said outer structure has a first stable state and a second stable state, and wherein said inner structure further comprises a magnetism device configured to generate a magnetic field within said common aperture, the magnetic field having a magnitude that biases said first stable state and said second stable state.

29. The superconducting structure of claim 28 wherein said first stable state and said second stable state are degenerate.

30. A method of trapping a quantized magnetic flux in an N-turn ring, wherein said N-turn ring comprises a plurality of connected turns about a common aperture, the method comprising:

introducing a localized break in a turn in said plurality of connected turns, said localized break interrupting a supercurrent in a portion of said turn, thereby inducing a quantized magnetic flux in said common aperture; and restoring supercurrent in said portion of said turn by removing said localized break in said turn, thereby trapping said quantized magnetic flux in said common aperture.

31. The method of claim 30, wherein said localized break in said turn is introduced by passing a bias current through a Josephson junction in said portion of said ring, wherein said bias current causes said Josephson junction to toggle from a superconducting zero voltage state to a nonsuperconducting voltage state.

32. The method of claim 30 wherein a turn in said plurality of connected turns comprises a type I or type II superconductor.

33. The method of claim 30 wherein said introducing step further comprises running a current through a cryotron that encloses one or more turns in said N-turn ring, thereby introducing said localized break in said turn in said N-turn ring.

34. The method of claim 30 wherein said quantized magnetic field is homogeneous throughout said common aperture.

35. The method of claim 30 wherein said quantized magnetic field is inhomogeneous in said common aperture.

36. The method of claim 30, wherein said quantized magnetic field has a gradient in at least one direction in said common aperture.

37. The method of claim 30 wherein a superconducting structure encompasses a portion of said N-turn ring and wherein said introducing and restoring steps bias said superconducting structure.

38. The method of claim 37 wherein said superconducting structure has a first energy state and a second energy state that are degenerate during all or a portion of said restoring step.

39. The method of claim 37 wherein said superconducting structure has a first energy state and a second energy state that have a predetermined energy differential during said restoring.

40. The method of claim 37 wherein said superconducting structure is a persistent current qubit.

41. A sub-flux quantum generator comprising:

an N-turn ring means comprising a plurality of connected turns about a common aperture, wherein a width $T_{50}$ of each respective turn in said plurality of connected turns exceeds the London penetration depth of a superconducting material used to make the respective turn;

a switching device means configured to introduce a localized reversible break in a superconducting current in at least one turn in said plurality of connected turns; and a magnetism device means configured to generate a magnetic field within said common aperture.

42. A superconducting device comprising an outer structure means and an inner structure means, wherein said outer structure means comprises a superconducting ring that encompasses all or a portion of said inner structure, the superconducting ring including a Josephson junction; and said inner structure means includes an N-turn ring, said N-turn ring comprising a plurality of connected turns about a common aperture, wherein a width $T_{50}$ of each respective turn in said plurality of connected turns exceeds the London penetration depth of the superconducting material used to make the respective turn.

* * * * *